(12) United States Patent
Komiya et al.

(10) Patent No.: US 7,648,610 B2
(45) Date of Patent: Jan. 19, 2010

(54) BAFFLE PLATE, APPARATUS FOR PRODUCING THE SAME, METHOD OF PRODUCING THE SAME, AND GAS PROCESSING APPARATUS CONTAINING BAFFLE PLATE

(75) Inventors: Taro Komiya, Takarazuka (JP); Hatsuo Osada, Nirasaki (JP); Shigetoshi Hosaka, Nirasaki (JP); Tomihiro Yonenaga, Nirasaki (JP); Masayuki Tomoyasu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/168,451

(22) PCT Filed: Dec. 21, 2000

(86) PCT No.: PCT/JP00/09106

§ 371 (c)(1),
(2), (4) Date: Oct. 11, 2002

(87) PCT Pub. No.: WO01/48790

PCT Pub. Date: May 7, 2001

(65) Prior Publication Data

US 2003/0094135 A1    May 22, 2003

(30) Foreign Application Priority Data

Dec. 24, 1999    (JP)    ................................. 11/368473

(51) Int. Cl.
*H01L 21/3065*    (2006.01)
*H01L 21/306*    (2006.01)
*C23C 16/00*    (2006.01)
*C23C 16/455*    (2006.01)

(52) U.S. Cl. .................................. 156/345.29; 118/715

(58) Field of Classification Search .................. 118/715; 156/345.33, 345.29, 345.34; 700/121, 123, 700/159, 182
See application file for complete search history.

(56) References Cited

U.S. PATENT DOCUMENTS 4,297,162 A * 10/1981 Mundt et al. ................. 438/729

(Continued)

FOREIGN PATENT DOCUMENTS

EP    758 688    2/1997

(Continued)

OTHER PUBLICATIONS

Derwent Abstract of WO 99/45584.*

*Primary Examiner*—Jeffrie R Lund
(74) *Attorney, Agent, or Firm*—Pillsbury Winthrop Shaw Pittman, LLP

(57) ABSTRACT

The present invention provides a gas process apparatus that realizes uniform exhaust without depending on process conditions, a gas process chamber that constitutes the gas process apparatus, a baffle plate mounted on the gas process chamber, a method of producing the baffle plate, and an apparatus for producing the baffle plate. The baffle plate of the present invention serves as a partition between a process space in which a chemical process is carried out with a supplied gas, and a duct that is adjacent to the process space and functions to discharge exhaust gas generated as a result of the chemical process. In accordance with the difference between the pressures on both sides of the baffle plate, which difference varies depending on the location on the baffle plate, the baffle holes are disposed on a plurality of locations on the baffle plate.

8 Claims, 14 Drawing Sheets

U.S. PATENT DOCUMENTS

| | | | | |
|---|---|---|---|---|
| 4,590,042 A | * | 5/1986 | Drage | 422/186.06 |
| 5,441,568 A | | 8/1995 | Cho et al. | 118/715 |
| 5,595,602 A | | 1/1997 | Harlan | 118/715 |
| 5,997,589 A | * | 12/1999 | Tien | 29/25.01 |
| 6,113,700 A | * | 9/2000 | Choi | 118/715 |
| 6,120,605 A | * | 9/2000 | Sato | 118/715 |
| 6,176,969 B1 | * | 1/2001 | Park et al. | 156/345.29 |
| 6,402,847 B1 | * | 6/2002 | Takagi et al. | 118/715 |
| 6,415,736 B1 | * | 7/2002 | Hao et al. | 118/723 E |
| 6,544,380 B2 | * | 4/2003 | Tomoyasu et al. | 156/345.51 |
| 6,726,801 B2 | * | 4/2004 | Ahn | 156/345.29 |
| 6,733,620 B1 | * | 5/2004 | Sugiyama et al. | 156/345.29 |
| 6,767,429 B2 | * | 7/2004 | Amano | 156/345.29 |
| 6,837,966 B2 | * | 1/2005 | Nishimoto et al. | 156/345.29 |
| 2002/0134308 A1 | * | 9/2002 | Amano | 118/715 |
| 2003/0094135 A1 | * | 5/2003 | Komiya et al. | 118/715 |
| 2003/0140851 A1 | * | 7/2003 | Janakiraman et al. | 118/715 |
| 2004/0129218 A1 | * | 7/2004 | Takahashi et al. | 118/715 |

FOREIGN PATENT DOCUMENTS

| | | | |
|---|---|---|---|
| JP | 62098727 | | 5/1987 |
| JP | 63111621 | | 5/1988 |
| JP | 63141318 | | 6/1988 |
| JP | 05315292 A | * | 11/1993 |
| JP | 8008239 | | 1/1996 |
| JP | 8045917 | | 2/1996 |
| JP | 8-64489 | | 3/1996 |
| JP | 2927211 | | 7/1999 |
| JP | 11317397 A | * | 11/1999 |
| WO | WO 99/45584 | * | 9/1999 |

* cited by examiner

BAFFLE PLATE, APPARATUS FOR PRODUCING THE SAME, METHOD OF PRODUCING THE SAME, AND GAS PROCESSING APPARATUS CONTAINING BAFFLE PLATE

This application is the National Phase of International Application PCT/JP00/09106, which was filed in the English language on Dec. 21, 2000 and designated the U.S., which in turn claims priority to Japanese application No. 11-368473, filed Dec. 24, 1999, both of which are incorporated herein in their entirety by reference.

TECHNICAL FIELD

The present invention relates to a gas processing apparatus that discharges exhaust gas generated as a result of chemical processing, to a baffle plate incorporated into the gas processing apparatus, and a method of and apparatus for producing the baffle plate.

BACKGROUND ART

FIG. 1 shows the structure of an apparatus that performs single wafer processing in a hermetically sealed chamber used in a wafer preprocessing step of semiconductor production. As shown in FIG. 1, the processing apparatus comprises: a wafer placing stand 3 on which a wafer 1, a glass substrate, and other electronic material substrates are placed; an exhaust duct 5 that surrounds the wafer stand 3; a baffle plate that is provided with baffle holes 7 and placed on the exhaust duct 5; and an exhaust pipe 11 that is connected to the exhaust duct 5. In FIG. 1, arrows 13 indicate the exhaust flow of the process gas.

To perform uniform processing on the surface of the wafer 1 in the apparatus for performing single wafer processing in a hermetically sealed chamber, for instance, in a CVD (Chemical Vapor Deposition) apparatus, an etching apparatus, an annealing apparatus, and a dry cleaning apparatus, it is necessary to supply the process gas uniformly on the surface of the wafer 1 with a shower head, and to flow the exhaust gas generated from the contact with the wafer 1 in the radial direction evenly at any circumferential angle of the wafer 1 (this process will be hereinafter referred to as "uniform exhaust").

The uniform exhaust is essential in the single wafer processing apparatus (such as a metallic CVD apparatus) to perform a uniform film forming operation. The single wafer processing apparatus that performs a so-called rate-determining process in which the reaction rate on the surface of the wafer 1 depends on the transportation rate of the material gas. Also, in a plasma processing apparatus in which the residence time of the gas on the wafer has an influence on the concentration variation of labile species (i.e., in a plasma CVD apparatus or a plasma etching apparatus), the uniform exhaust is essential for obtaining a uniform film forming rate and an etching rate.

In a normal case where the connecting port of the exhaust pipe 11 connected to the pump for exhausting the wafer processing gas deviates from the center axis of the wafer 1 and opens toward the gas processing chamber, it is difficult to exhaust the gas evenly from the center of the gas flow on the wafer in the every circumferential direction. In order to solve this problem, the exhaust duct 5 is extended from the connecting port of the exhaust pipe 11 to the entire periphery of the wafer 1, and the baffle plate 9 is disposed as a separation wall on boundary between the exhaust duct 5 and the chamber. Normally, a number of baffle holes 7 are formed at uniform intervals in the baffle plate 9, thereby obtaining uniform exhaust.

The baffle plate 9 aims to decrease unevenness of exhaust gas flow on the surface of the wafer 1. The principles of the baffle plate 9 reside in forming the baffle holes 7 that causes a greater flow resistance than the flow resistance in the exhaust duct 5 so as to reduce a variation in exhaust conductance that depends on the circumferential angle and to make the flow rate of the exhaust gas around the wafer 1 uniform in the circumferential direction.

To make the exhaust flow rate of the baffle holes 7 uniform, it is necessary to equalize the differential pressures at the respective baffle holes 7 on both sides of the baffle plate 9. However, in a conventional technique of forming the identical baffle holes 7 on the baffle plate 9 at uniform intervals, it is difficult to obtain uniform exhaust flow 13 at every circumferential angle of the wafer 1. The main reason for this is that the difference between the inner pressure of the exhaust duct 5 and the pressure in the chamber in the normal film forming operation is small. As a result, the adverse influence of the inner pressure of the exhaust duct 5 on the variation of the differential pressures due to a fluid pressure loss becomes too great to ignore.

It may be possible to reduce the pore size of each baffle hole 7 so as to increase the differential pressures on both sides of baffle hole 7 to such a degree that can nullify a variation of the inner pressure of the exhaust duct 5. However, a smaller pore size of each baffle hole 7 will results in an increase of the pressure in the chamber. Enlarging the pore size of each baffle hole 7 to reduce the flow resistance in the exhaust duct 5 is also undesirable, because a larger pore size results in a decrease of the flow resistance in the exhaust duct 5. Accordingly with the conventional apparatus employing the baffle plate 9, there remain problems that a relatively large amount of exhaust gas flows on the surface of the wafer in the vicinity of the connecting port of the exhaust pipe 11, and that the flow rate of the exhaust gas at the connecting port of the exhaust pipe 11 and at the baffle holes 7 on the other side is low.

In order to solve the above problems, Japanese Laid-Open Patent Application No. 63-141318 discloses a conductance plate provided with a plurality of holes having pore sizes proportional to the distances from the exhaust port. However, such a conductance plate does not function sufficiently to obtain uniform processing on a number of samples.

Furthermore, a conventional exhaust device has a simple structure having the exhaust pipe 11 connected to the side wall of the gas processing chamber (such a structure will be hereinafter referred to as "sidedraft exhaust structure"). In this conventional exhaust device, an exhaust port is normally formed on the side wall, causing much unevenness in exhaust gas flow. In order to solve such a problem, a structure having two or more connecting ports on the side wall of the gas processing chamber has been suggested, as disclosed in Japanese Laid-Open Patent Application No. 8-45917. With such a structure, however, the unevenness of exhaust gas flow can be corrected to some degree, but there is another problem that the structure becomes complicated, resulting in higher production costs.

As disclosed in Japanese Laid-Open Patent Application No. 63-111621, an exhaust device that exhausts from below the wafer stand in the coaxial direction with the central axis of the wafer has been suggested. With such an exhaust device, there are problems that the configuration of the exhaust device becomes too long in the central axis direction, and that the arrangement of various components (such as the wiring arrangement for a pusher pin for moving up and down the wafer, a suscepter heater, and a temperature heater) that are normally arranged below the wafer stand becomes difficult.

Also, in the conventional exhaust device using a porous baffle plate in a gas process chamber having a sidedraft exhaust structure, it has been difficult to designing and produce a uniform-exhaust baffle plate that can obtain uniform distribution of the flow rate of an exhaust gas in the circumferential direction on the wafer. The biggest reason of this is that a quantitative design method which is based on hydrodynamic theories was unknown. More specifically, as the baffle pore size becomes smaller, the exhaust flow rate becomes more uniform. However, the chamber inner pressure increases at the same time. As a result, this technique is not applicable to a normal process in which the chamber inner pressure needs to be low.

Meanwhile, Japanese Laid-Open Patent Application No. 8-64489 discloses a structure in which the baffle holes are arranged at varied intervals, and Japanese Patent No. 2927211 discloses a baffle plate provided with exhaust conductance adjusting holes that are displaced. However, it has been considered difficult to obtain an exhaust device that has a function to maintain uniform exhaust regardless of various process conditions such as the gas flow rate, the type of gas, temperatures and pressures. Even if the diameters and intervals of the baffle holes are varied, it is difficult to maintain predetermined uniformity in exhaust, except under specially prescribed process conditions.

Japanese Laid-Open Patent Application No. 62-98727 reads that "As shown in FIG. 2, a plurality of exhaust holes 10 are designed in accordance with the fluid conductance calculated from the flowing direction of an etching gas flowing from a gas introduction path 4 uniformly downward along the surface of the wafer 6". However, this reference only suggests that the pore size should be larger as the location of the hole becomes more distant from the main exhaust hole, while mentioning no detailed method or technique for designing the exhaust holes.

DISCLOSURE OF THE INVENTION

An object of the present invention is to provide a gas process apparatus that realizes uniform exhaust regardless of process conditions, a baffle plate that is mounted on the gas process apparatus, a method of producing the baffle plate, and an apparatus for producing the baffle plate.

The above objects of the present invention are achieved by a baffle plate that parts a process space in which a chemical process is carried out with a supplied gas from a duct that is adjacent to the process space for discharging an exhaust gas generated as a result of the chemical process. In this baffle plate, after a plurality of through holes are virtually formed at desired locations on the baffle plate, the plurality of through holes are actually formed at the desired location so that flow rates of the exhaust gas at the plurality of through holes become uniform. With this baffle plate, uniform exhaust required for the chemical process can be surely realized.

The above objects of the present invention are also achieved by a baffle plate that parts a process space in which a chemical process is carried out with a supplied gas from a duct that is adjacent to the process space for discharging an exhaust gas generated as a result of the chemical process. In this baffle plate, through holes are formed at a plurality of locations on the baffle plate, depending on pressure differences between two sides of the baffle plate. With this baffle plate, uniform exhaust required for the chemical process can be surely achieved.

In the above baffle plate, the through holes may be formed in accordance with a pressure variation of the exhaust gas along a flowing path of the exhaust gas inside the duct. More specifically, through holes may be formed so that the flow rates of the exhaust gas flowing through the through holes calculated in accordance with the Hagen-Poiseuille's law become constant. The above objects are also achieved by a baffle plate having at least three through holes at various intervals, or a baffle plate having at least two through holes having different pore sizes.

The above objects of the present invention are also achieved by a baffle plate that parts a process space in which a chemical process is carried out with a supplied gas from a duct that is adjacent to the process space for discharging an exhaust gas generated as a result of the chemical process, and a plurality of through holes are formed at desired locations. This baffle plate varies in thickness at two or more locations among the desired locations. With this baffle plate, the conductance of the exhaust gas flowing through the through holes can be adjusted.

The above objects of the present invention are also achieved by a baffle plate that parts a process space in which a chemical process is carried out with a supplied gas from a duct for exhausting an exhaust gas generated as a result of the chemical process. In this baffle plate, slits that penetrate through the baffle plate and vary in width along with a flowing path of the exhaust gas in the duct are formed in accordance with pressure differences between both sides of the baffle plate, the pressure differences varying depending on locations on the baffle plate. With this baffle plate, the conductance of the exhaust gas flowing through the slits can be adjusted.

The above objects of the present invention are also achieved by a baffle plate that parts a process space in which a chemical process is carried out with a supplied gas from a duct that is adjacent to the process space so as to discharge an exhaust gas generated as a result of the chemical process. In this baffle plate, slits that penetrate through the baffle plate and have uniform widths are formed along a flowing path of the exhaust gas inside the duct, and the baffle plate varies in thickness along the flowing path.

The above objects of the present invention are also achieved by a gas process apparatus that comprises: a process space including a stand on which an object to be processed is placed, and a gas supply unit for supplying a gas to the object to be processed so as to perform a chemical process on the object placed on the stand; a duct that is adjacent to the process space so as to discharge an exhaust gas generated as a result of the chemical process; and a discharging unit that is connected to the duct for discharging the exhaust gas. This gas process apparatus is characterized by further comprising a partition unit that parts the duct from the process space, and adjusts the flow rate of the exhaust gas flowing from the process space to the duct depending on pressure differences between both sides of a boundary surface, the pressure differences varying with locations on the boundary surface between the process space and the duct. With this gas process apparatus, uniform exhaust required for the chemical process can be surely realized.

The above objects of the present invention are also achieved by a method of producing a baffle plate that parts a process space in which a chemical process is carried out with a supplied gas from a duct that is adjacent to the process space so as to discharge an exhaust gas generated as a result of the chemical process. This method is characterized by comprising the steps of: calculating pressure differences between both sides of the baffle at desired locations on the baffle plate;

and forming through holes at a plurality of locations on the baffle plate, depending on the calculated pressure differences. By this method, a baffle plate that can realize uniform exhaust can be surely obtained.

The above objects of the present invention are also achieved by a method of producing a baffle plate that parts a process space in which a chemical process is carried out with a supplied gas from a duct that is adjacent to the process space so as to discharge an exhaust gas generated as a result of the chemical process. This method is characterized by comprising the steps of: calculating pressure differences between both sides of the baffle plate, the pressure differences varying with locations on the baffle plate, and a pressure variation of the exhaust gas along a flowing path of the exhaust gas inside the duct; and forming through holes at a plurality of locations on the baffle plate in accordance with the calculated pressure differences and the pressure variation.

The above objects of the present invention are also achieved by a method of producing a baffle plate that parts a process space in which a chemical process is carried out with a supplied gas from a duct that is adjacent to the process space for discharging an exhaust gas generated as a result of the chemical process. This method is characterized by comprising the step of forming a plurality of through holes in the baffle plate so that a flow rate of the exhaust gas calculated in accordance with the Hagen-Poiseuille's law becomes constant.

The above objects of the present invention are also achieved by a method of producing an apparatus for producing a baffle plate that parts a process space in which a chemical process is carried out with a supplied gas from a duct that is adjacent to the process space for discharging an exhaust gas generated as a result of the chemical process. This apparatus is characterized by comprising: a calculating unit that calculates pressure differences between both sides of the baffle plate at various locations on the baffle plate; and a hole forming unit that forms through holes at a plurality of locations on the baffle plate in accordance with the pressure differences calculated by the calculating unit.

In the above apparatus, the calculating unit calculates a pressure variation of the exhaust gas along a flowing path of the exhaust gas inside the duct, and the hole forming unit forms the through holes at the plurality of locations on the baffle plate in accordance with the pressure differences and the pressure variation calculated by the calculating unit.

The above objects of the present invention are also achieved by an apparatus for producing a baffle plate that parts a process space in which a chemical process is carried out with a supplied gas from a duct that is adjacent to the process space for discharging an exhaust gas generated as a result of the chemical process. This apparatus is characterized by comprising: a calculating unit that calculates hole forming locations so that flow rates of the exhaust gas at through holes formed in the baffle plate calculated in accordance with the Hagen-Poiseuille's law become uniform; and a hole forming unit that forms the through holes at the hole forming locations calculated by the calculating unit.

BEST MODE FOR CARRYING OUT THE INVENTION

Figure 1:
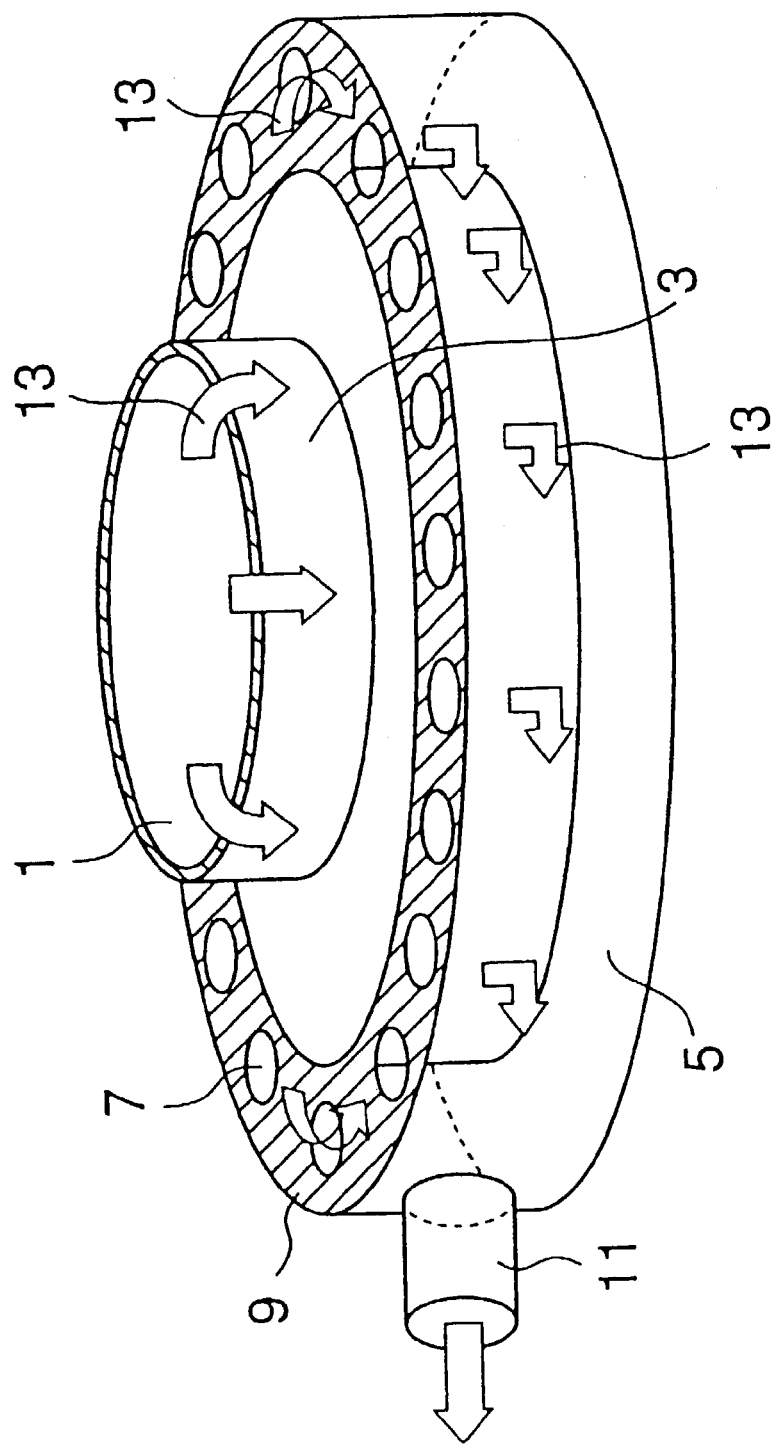
FIG. 1 shows the structure of an apparatus for processing single wafers in a hermetically sealed chamber in a wafer preprocessing in semiconductor production procedures.

The following is a description of embodiments of the present invention, with reference to the accompanying drawings. Throughout the drawings, the same components are denoted by the same reference numerals.

In the embodiments of the present invention, equations are employed for virtually determining the shapes and sizes of baffle passages, the diameters and intervals of baffle holes, the number of baffle holes, the widths of slits, and the thickness variation of the baffle plate. Based on values calculated using those equations, baffle plates having the optimum shapes for obtaining circumferentially uniform flow rates of a gas flowing on the wafer will be specified in the following description.

A baffle plate having the fluid-mechanically optimum shape is logically proved to be capable of obtaining uniform exhaust, regardless of process conditions such as the flow rate of a process gas, the type of the process gas, temperatures, and pressures.

The basic ideas of the embodiments of the present invention are to design the baffle passages for making the exhaust gas flow uniform in such a manner that equalizes the exhaust conductance from a given location near the wafer 1 to the connecting port of the exhaust pipe of the chamber. In order to achieve this, the pressure loss due to the fluid friction of the gas flowing toward the connecting port of the exhaust pipe needs to be evaluated for each gas passage. The most noteworthy pressure loss is caused between the fluid resistance of a baffle passage and the fluid resistance of a gas flowing through the exhaust duct on the downstream of the baffle passage. To obtain those fluid pressure losses, the Fanning's equation or the Hagen-Poiseuille's law are used, so that the baffle passages are designed based on the logical relationship between the shape and size, and the flow rates and differential pressures of the baffle holes or the baffle slits and exhaust duct.

The relational expressions between the differential pressures, the flow rates, and the pore sizes are basically essential logical equations for designing the optimum shape of a baffle plate that can obtain uniform exhaust. For instance, the flow rate of a baffle hole or a slit is proportional to the fourth power of its pore size, proportional to the third power of the slit width, inversely proportional to the plate thickness, and proportional to the square of the difference between the pressure above the passage and the pressure below the passage. The shape of the passage for uniform exhaust in the circumferential direction is determined based on a variation of the duct inner pressure, which varies in a wide range due to an increase of the gas flow rate on the downstream side in the duct. However, a highly analytical technique has been required for determining the three factors, i.e., the shapes, the flow rates, the pressures of the passages.

Under the above conditions, five types of baffle plates having the optimum shapes were designed and produced based on the newly introduced logical equations. These baffle plates were then mounted on a single wafer process apparatus to obtain uniform exhaust. The five types include: 1) a uniform-size, uniform-thickness porous baffle plate that has baffle holes arranged at varied intervals for obtaining uniform exhaust; 2) a uniform-interval, uniform-thickness porous baffle plate that has baffle holes having varied pore sizes for uniform exhaust; 3) a uniform-size, uniform-interval porous baffle plate that varies in thickness for uniform exhaust; 4) a uniform-thickness slit-type baffle plate that has slits having varied widths for uniform exhaust; and 5) a uniform-width slit baffle plate that varies in thickness for uniform exhaust.

Among the above baffle plates, the easiest one for processing is the baffle plate 1) having baffle holes arranged at varied intervals. This structure can be easily obtained by forming holes having different angles in the circumferential direction using cutting blades of the same diameter. In this manner, uniform exhaust can be achieved at a low cost. On the other hand, with the above baffle plate 2) having baffle holes having varied pore sizes, it is necessary to prepare many cutting blades having different diameters. Meanwhile, the baffle plates 3) and 5) that vary in thickness in the circumferential direction are relatively easy to produce. However, it is not so easy to produce the baffle plate 4) having slits that vary in width. Despite the varied difficulties in production, the optimized baffle plates have the same uniform exhaust, and can be effectively used in a single wafer process chamber.

In the above baffle plate 4), slits are formed for exhaust, and the widths of the slits are continuously varied in the fluid-mechanically optimum manner, so that the smallest necessary pressure loss can be obtained for uniform exhaust. On the other hand, a porous baffle plate requires a relatively great differential pressure, and the pressure in the gas process chamber unnecessarily rises.

To avoid the above problems, the embodiments of the present invention provide porous baffle plates and slit-type baffle plates that can obtain uniform exhaust in a single wafer process chamber by a new design method. Also, the embodiments of the present invention provide a gas process apparatus including any one of the above baffle plates. Such a gas process apparatus may be applied to any one of apparatuses, such as etching apparatuses, plasma apparatuses, and thermal CVD (Chemical Vapor Deposition) apparatuses.

In the following, the basic theoretical formulas of the present invention will be described. In a single wafer processing apparatus having a sidedraft exhaust structure, a gas enters the exhaust duct 5 from the surface of the wafer 1 through the baffle holes 7 around the wafer 1. After going half around inside the exhaust duct 5, the gas reaches the connecting port of the exhaust pipe 11 disposed on the side wall of the gas processing chamber. Here, the flow rate at each baffle hole 7 is determined by the difference between the inner pressure of the exhaust duct 5 and the pressure in the chamber. This relationship can be expressed by a Hagen-Poiseuille's law that holds between the flow rate and the pressure difference in a case where viscous flow passes through the fluid passage.

$$\Delta P = 32 \mu L u / D^2 \quad (1)$$

wherein D indicates the inner diameter [m] of the fluid passage, L indicates the length [m] of the fluid passage having the inner diameter D, $\Delta P$ indicates the differential pressure [Pa] with the pressure at the downstream of the distance L, $\mu$ indicates the viscosity of the gas [Pa·sec], and u indicates the flow rate of the gas [m/sec].

Taking the variation of the volume due to a pressure into account, an equation using a mass velocity G [kg/m$^2$/sec] can be obtained as will be shown later.

The Hagen-Poiseuille's law is originally a relational expression with respect to a fluid pressure loss caused when a viscous fluid laminar-flows through fluid passages in a circular duct. In a case where the fluid are not circular, a representative size called an equivalent diameter is used, instead of the diameter of a circle, to obtain the same relational expression. According to "Chemical Engineers' Handbook (5th revised edition)" (edited by Chemical Engineering Society, and issued by Maruzen), the equivalent diameter is a value obtained by multiplying a hydraulic radius by 4. The hydraulic radius is obtained by dividing the cross section area of the passage by the circumference adjacent to the fluid on the cross section of the passage. In the following, the cross section of the fluid passage is circular for ease of explanation, but the same effects can be achieved by using the equivalent diameter when the cross section of the fluid passage is not circular.

As for the laminar flow region in a range to which the Hagen-Poiseuille's law is applied, the Reynolds' number of the gas flow in the apparatus to which the present invention is applied is 100 or smaller. When the Reynolds' number is 2000 or smaller, it is normally possible to maintain laminar flow. As for the applied pressure range, 20 pascal or greater should be enough to obtain viscous flow. Even at a low pressure, 10 pascal should be enough in practical use, as long as the diameter of the fluid passage is 20 or more times as great as the mean free path of gas molecules.

It should be noted that the mean free path of nitrogen molecules at 20 Pa and 200° C. is approximately 500 μm, which is sufficiently small, compared with the equivalent diameter, 27 mm, of the duct in the following embodiments. The diameters of the passages of the baffle holes are smaller than the diameter of the duct, but the pressure is higher in the baffle passages. As a result, the mean free path should be much smaller. At 93.3 Pa, for instance, the mean free path should be approximately 100 µm. Accordingly, the following equation should hold in practical use.

$$\Delta P = {}^0P - \{{}^CP^2 - 64\mu LRTG/MD^2\}^{0.6} \quad (2)$$

wherein the ${}^0P$ indicates the pressure [Pa] at the reference point, R indicates the gas constant (8.3143 [m² kg/mol/sec²]), T indicates the temperature [K], and M indicates the molecular weight [kg/mol].

Figure 2:
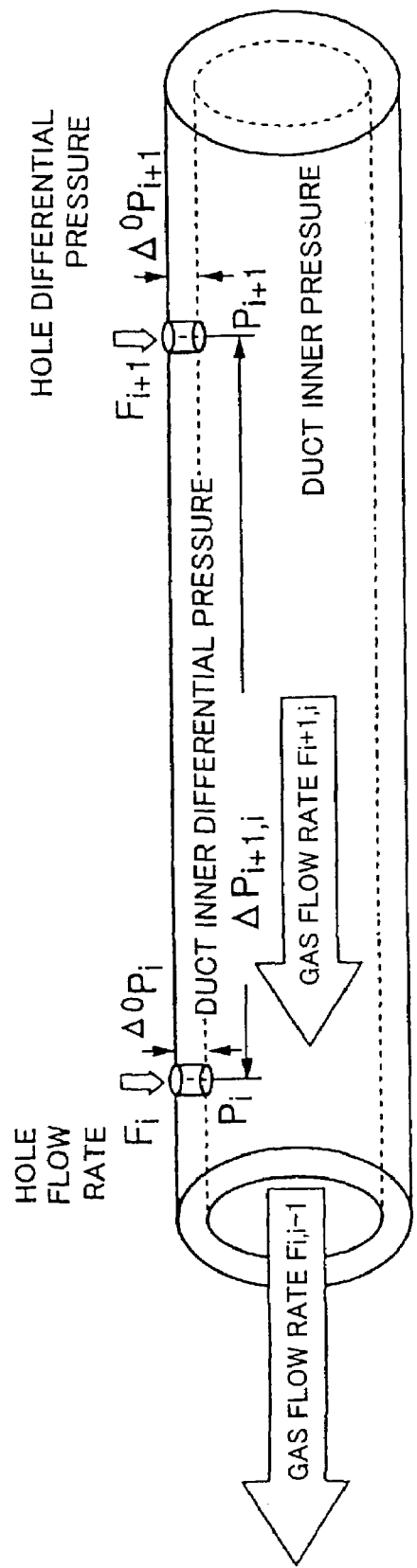
FIG. 2 shows a gas flow and a differential pressure in an exhaust duct.

FIG. 2 shows the gas flow and differential pressure in the exhaust duct. As shown in FIG. 2, numbers i=1, 2, 3, . . . are allocated to the baffle holes from the most downstream side of the exhaust duct. Here, the relationships among the pore size $D_i$, the pore length $L_i$, the duct inner pressure $P_i$, the gas flow rate $F_i$, the differential pressure $\Delta^0 P_i$ between the process chamber pressure ${}^0P$ and the duct inner pressure $P_i$, the differential pressure (pressure variation) $\Delta P_{i+1,i}$ between the duct inner pressure $P_{i+1}$ below the hole adjacent to the fluid passage of the exhaust gas and the duct inner pressure $P_i$, the equivalent diameter $D_H$ of the duct, and the length $L_{i+1,i}$ of the passage of the duct from the ith hole and the i+1 the hole, are expressed by the following equations. Here, when the cross section of the passages of the duct is not circular, for instance, when the cross section is a rectangle having a long side a and a short side b, the equivalent diameter of the duct should be 2ab/(a+b).

$$P_{i+1} = P_i + P_{i+1,i} \quad (3)$$

$$\Delta^0 P_i = {}^0P - P_i \quad (4)$$

$$P_i = \{{}^0P^2 - 64 L_i RTG_i / Md_i^2\}^{0.6} \quad (5)$$

The equation (5) that expresses $P_i$ can be transformed into an equation (7) by an equation (6) that expresses the hole gas flow rate $F_i$ and the mass velocity $G_i$.

$$F_i = (\pi/4)(0.0224 D_i^2/M) G_i/(1E-6/60) [\text{sccm}] \quad (6)$$

$$P_i = \{{}^0P^2 - 64\mu L_i RTF_i (1E-6/60)(1/0.0224)/(D_i^4/4)\}^{0.5} \quad (7)$$

With the substitution of $\delta$ (=64 µRT(1E−6/60)(1/0.0224)), the equation (7) can be further transformed into the following equation (8).

$$P_i^2 = {}^0P^2 - \delta L_i F_i/(\pi D_i^4/4) \quad (8)$$

From the above equation (8), the flow rate $F_i$ of each hole can be expressed by the following equation (9) as functions of the duct inner pressure $P_i$, the inner diameter $D_i$, and the hole length $L_i$.

$$F_i = ({}^0P^2 - P_i^2)(\pi D_i^4/4)/(\delta Li) \quad (9)$$

Meanwhile, the duct inner pressure Pi is expressed by the product of the downstream pressure and the differential pressure in the following equation (10).

$$P_i = P_1 + \Delta P_{2,1} + \Delta P_{3,2} + \Delta P_{4,5} \ldots + \Delta P_{i,i-1} \quad (10)$$

The inner differential pressure of two neighboring holes in the duct is expressed by the following equation (11).

$$\Delta P_{i,i-1} = P_i + \Delta P_{i-1} \quad (11)$$

By substituting the equation (8) in the above equations (10) and (11), the following equation (12) can be obtained.

$$\Delta P_{i,i-1} = P_i - \{P_i^2 - \delta L_{i,i-1} F_{i,i-1}/(\pi D_H^4/4)\}^{0.5} \quad (12)$$

From the equations (11) and (12), the following equation (13) is obtained.

$$P_{i-1}^2 = P_i^2 - \delta L_{i,i-1} F_{i,i-1}/(\pi D_H^4/4) \quad (13)$$

From the equation (13), the following equation (14) is obtained.

$$P_i = \{P_{i-1}^2 - \delta L_{i,i-1} F_{i,i-1}/(\pi D_H^4/4)\}^{0.6} \quad (14)$$

Here, $F_{i,i-1}$ in the equation (14) is the gas flow rate in a section in the duct that is adjacent to the ith hole, and is expressed by the following equation (15).

$$F_{i,i-1} = F_0/2 - F_1/2 - (F_2 + F_3 + \ldots + F_{i-1}) \quad (15)$$

The equation (15) is substituted in the equation (14) to obtain the following equation (16), which expresses the duct inner pressure $P_1$ below the ith hole by the flow rate of a hole that is situated at a lower side of the ith hole.

$$P_1 = [P_{i-1}^2 + \delta L_{i,i-1}\{F_0/2 - F_1/c - (F_2 + F_3 + \ldots + F_{i-1})\}/(\pi D_H^4/4)]^{0.5} \quad (16)$$

From the above equations, a desired exhaust flow rate can be determined for each hole starting from the downstream side. By this method, the gas flow rate of each hole can be detected, so that the uniformity of the porous baffle plate can be detected.

Using this technique, the uniformity of the exhaust flow rate with a conventional baffle plate is calculated for a comparison purpose. If the number of holes, the pore size, the hole interval, and the plate thickness are known, the uniformity of the exhaust flow rate of the porous baffle plate is determined as follows. First, the duct inner pressure $P_1$ below the first hole is assumed, and the flow rate $F_1$ is determined from the pore size $D_1$ and the duct inner pressure $P_1$ of the first hole. The inner pressure $P_2$ and the flow rate $F_2$ of the second hole are then calculated, and the flow rates of all the remaining holes are calculated in order. The duct inner pressure $P_1$ of the first hole should be determined so that the total of the exhaust flow rate of all the holes becomes equal to the flow rate $F_0$ [sccm] of the process. This calculation should be easily made using spreadsheet software. The unit [sccm] is the amount of gas (cm³) that flows per minute in a normal state.

Without using the technique of determining the shape of a baffle plate based on the relational expressions in accordance with the present invention, it is difficult to determine a satisfactory shape by repeating the measurement of the flow rate variation of test baffle plates. It is also difficult to determine the shape of a baffle plate by a fluid simulation method using a computer, because repeating trial-and-error simulations by inputting an unlimited number of parameters for shape determination without any analytical barometers is not very efficient.

Accordingly, by the method of the present invention, the shape and size of required baffles for uniform exhaust can be analytically determined, and such baffles can be efficiently produced.

Figure 3:
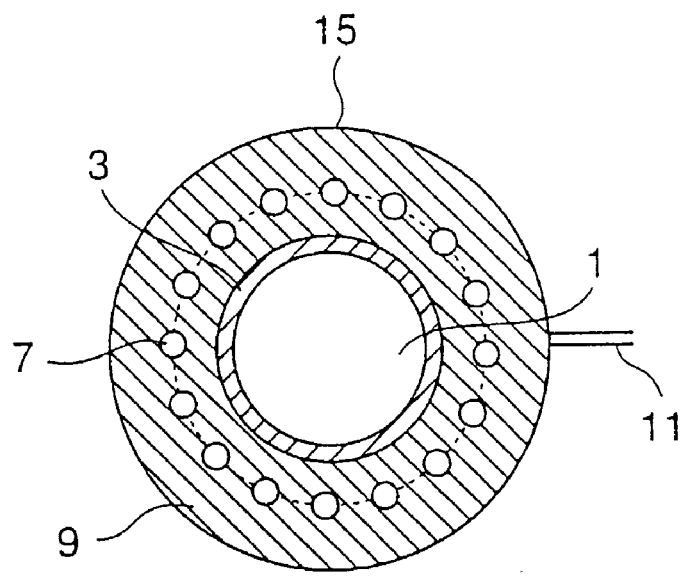
FIG. 3 shows the structure of a conventional baffle plate.
Figure 4:
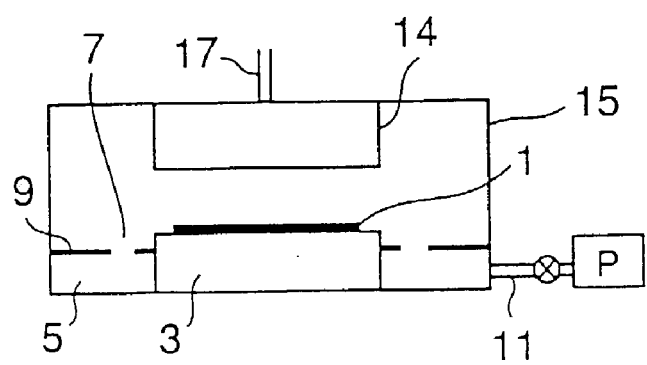
FIG. 4 shows the structure of a gas process chamber on which the baffle plate of FIG. 3 is mounted.

FIG. 3 shows the structure of a conventional baffle plate, and FIG. 4 shows the structure of the gas processing chamber 15 provided with the baffle plate 9 shown in FIG. 3. Here, an exhaust pump P is connected to the gas processing chamber 15 so as to form a gas processing device.

As shown in FIG. 3, the baffle plate 9 are provided with the baffle holes 7 having the same pore size and formed on the circumference at uniform intervals. If the baffle plate 9 having such a structure is employed, a gas supplied from a gas introduction pipe 17 into the wafer 1 via a shower head 14 is discharged through the baffle hole 7 in the vicinity of the connecting port of the exhaust pipe 1 connected to the exhaust pump P. As a result, the exhaust in the circumferential direction of the wafer 1 has a poor uniformity. On the other hand, if the pore size of each baffle hole 7 is made smaller, the uniformity can be improved. However, the pore size of each baffle hole 7 cannot be made very small in view of the upper limit of the process pressure.

The uniformity of the exhaust flow rate in the circumferential direction of a wafer in a case where a conventional baffle plate provided with baffle holes having uniform pore sizes, uniform thicknesses, and uniform intervals is employed is shown in Table 1 for reference. In Table 1, "uniformity" can be determined by calculating (maximum flow rate−minimum flow rate)/(maximum flow rate+minimum flow rate) from the maximum value and the minimum value of the flow rate of each baffle hole. If the "uniformity" value becomes greater, the flow rates of the baffle holes become more uneven. As the "uniformity" value becomes smaller, the flow rates of the baffle holes become more uniform.

differential pressure with the chamber pressure of 93.3 Pa is 29.7 Pa, which is the largest. Since the duct inner pressure becomes higher at a location further away from the exhaust outlet, the differential pressure with the chamber inner pressure becomes lower at such a location. Accordingly, the exhaust flow rate becomes the smallest at a location furthest from the connecting port of the exhaust pipe 11.

As shown in Table 1, the exhaust uniformity becomes poorer with a larger pore size. On the other hand, the exhaust uniformity improves with a smaller pore size. However, with a small pore size, it is necessary to reduce the duct inner pressure, because a large differential pressure is required for exhausting the gas at a predetermined flow rate with a small pore size. In this example, the uniformity value with the pore size of 2.444 mm can maintain the uniform value of 19.0%. With the smaller pore sizes of 2.0 mm and 1.0 mm, the exhaust becomes too low. For instance, to maintain the same chamber pressure with the pore size of 2.0 mm, the exhaust gas flow rate needs to be reduced to 51%.

TABLE 1

| PORE SIZE | mm | 5.0 | 4.0 | 3.0 | 2.5 | 2.444 | 2.0 | 1.0 |
|---|---|---|---|---|---|---|---|---|
| MINIMUM FLOW RATE | sccm | 2.6 | 6.9 | 12.2 | 14.3 | 14.5 | 8.0 | 0.591 |
| MAXIMUM FLOW RATE | sccm | 62.0 | 41.0 | 26.1 | 21.5 | 21.3 | 9.6 | 0.598 |
| MAX/MIN | % | 23.7 | 6.0 | 2.1 | 1.50 | 1.47 | 1.2 | 1.01 |
| FLOW RATE UNIFORMITY | % | 91.9 | 71.2 | 36.1 | 20.1 | 19.0 | 9.1 | 0.6 |
| EXHAUST | % | 100 | 100 | 100 | 100 | 100 | 51 | 3.6 |
| LOWEST DUCT PRESSURE | Pa | 85.3 | 79.9 | 63.6 | 27 | 6.67 | 6.67 | 6.67 |

Table 1 shows data in a case where a porous baffle plate having a thickness of 1 mm is placed on an exhaust duct having a width of 25 mm, a depth of 30 mm, and a pitch circle radius of 120 mm in a single tungsten CVD apparatus. Seventy-two baffle holes having uniform pore sizes are placed on the pitch circle at uniform intervals at every 5 degrees. Using this apparatus, a CVD process gas having an exhaust total flow rate $F_0$ of 1203 sccm was processed. The baffle hole pore sizes are 5 mm, 4 mm, 3 mm, 2.5 mm, 2.444 mm, 2 mm, and 1 mm, and calculated values are shown for each pore size. Under the processing conditions, the pressure $^0P$ in the chamber on the upstream side of the baffle holes 7 is 93.3 Pa, the temperature T is 520° C., the average molecular weight of the gas is 0.0596 kg/mol, the viscosity μ is 3.625E−5 Pa·sec, and the limit of the suction pressure of the exhaust outlet is 6.67 pa.

As shown in Table 1, the exhaust flow rate is 12.2 sccm at the smallest and 26.1 sccm at the largest with relatively small baffle holes each having a pore size of 3 mm. The exhaust uniformity obtained by calculating the (maximum flow rate−minimum flow rate)/(maximum flow rate+minimum flow rate) is 36.1%, which is a poor value. The maximum flow rate is obtained at the baffle hole closest to the exhaust outlet. The duct inner pressure immediately below the baffle hole closest to the exhaust outlet is 63.6 Pa at the smallest, where the In the following, the five types of suitable baffle plates will be described.

Embodiment 1

In a first embodiment of the present invention, a porous baffle plate having uniform hole pore sizes and uniform thicknesses for uniform exhaust with a varying pitch between baffle holes.

The porous baffle plate of this embodiment has baffle holes each having the same pore size. However, the intervals between the baffle holes are varied to maintain the average exhaust flow rate uniform in the circumferential direction.

Figure 5:
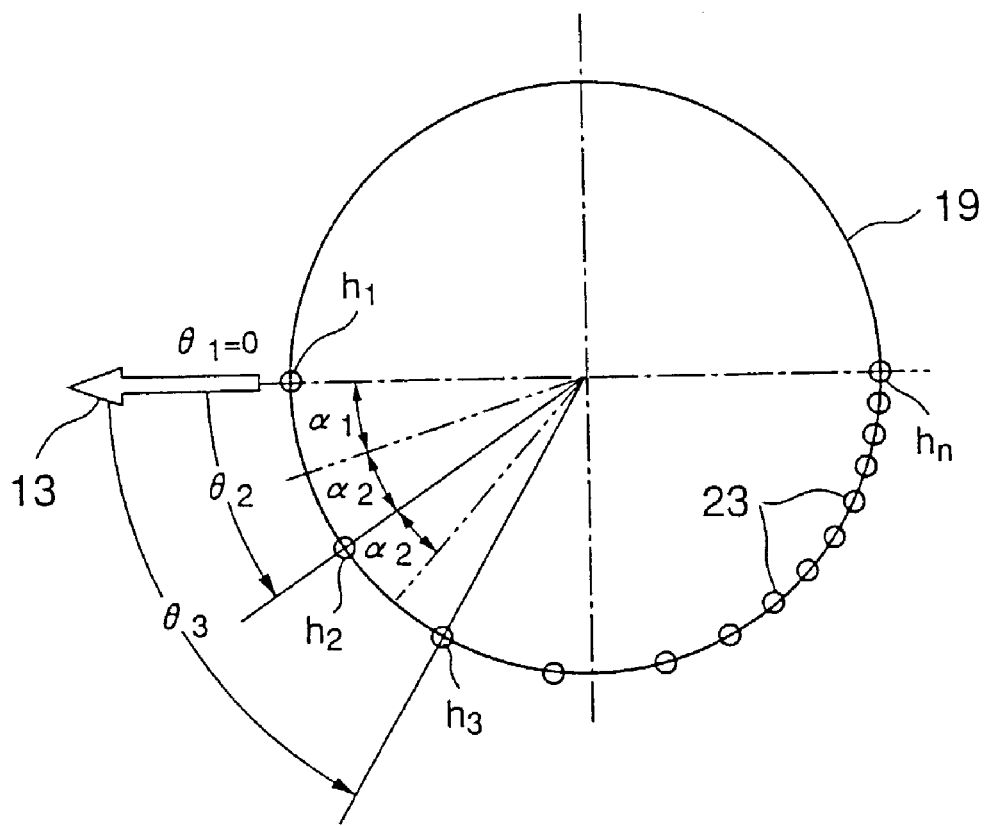
FIG. 5 illustrates the arrangement of baffle holes formed in the baffle plate of a first embodiment of the present invention.

FIG. 5 illustrates the arrangement of baffle holes 23 formed in a baffle plate 21 of the first embodiment. As shown in FIG. 5, the interval between each two baffle holes 23 on the downstream side, which is close to the connecting port of the exhaust pipe, is wider than on the upstream side, taking into account an increase of the exhaust flow rate of each baffle hole due to an excessive differential suction pressure. The arrangement of the hole intervals necessary to make the average exhaust flow rate uniform on the circumference is as follows.

A location at the angle of circumference of the ith hole is $\theta_i$ degrees, with the connecting port of the exhaust pipe being the origin, as shown in FIG. 5. In the following description, the first hole h1 is located at the same angle of circumference as the exhaust port, i.e., $\theta_1 = 0°$. However, the arrangement of this embodiment can be used in other situations. The flow rate of the exhaust gas passing through the ith holes is $F_i$ [sccm], and the duct inner pressure below the ith hole is $P_i$ [Pa]. The equivalent diameter $D_H$ [m], the thickness of the baffle plate is $L_0$ [m], the radius of the pitch circle 19 of the hole is r [m], the total exhaust flow rate is $F_0$ [sccm], the pressure of the processing chamber is $^0P$ [Pa]. The angle of the circumferential angle region in which the ith hole is $\pm\alpha_1$ degrees. Here, the following equations hold.

$$\theta_1 = 0 \quad (17)$$

$$F_1 = (^0P^2 - P_1^2)(\pi D_0^4/4)/\delta L_0 \quad (18)$$

$$\alpha_1 = (180) F_1/F_0 \quad (19)$$

$$\theta_2 = (\alpha_1 + 180 F_1/F_0)/\{1 + (1 - F_1/F_0)(\pi r/2L_0)(D_0/D_H)^4\} \quad (20)$$

$$F_2 = (\theta_2 - \alpha_1) F_0/180 \quad (21)$$

$$\alpha_2 = (180) F_2/F_0 = \theta_2 - \theta_1 - \alpha_1 \quad (22)$$

$$P_2 = [P_1^2 + (\delta r \theta_2 (F_0 - F_1)/360/\{(1/4)D_H^4\}]^{0.5} \quad (23)$$

$$\delta = (64\mu RT)(1E-6/60)(1/0.0224) \quad (24)$$

Generally, with i being greater than 2, the following equations hold.

$$\theta_i = \{\theta_{i-1} + \alpha_{i-1} + 180 F_{i-1}/F_0 + (\pi r/L_0 F_0)(F_0/2 - F_1/2 F_2 - \ldots - F_{i-1})(D_0/D_H)^4 \theta_{i-1}\}/\{1 + (r\pi/L_0 F_0)(F_0/2 - F_1/2 - F_2 - F_1 - \ldots - F_{i-1})(D_0/D_H)^4\} \quad (25)$$

$$\alpha_i = \theta_i - \theta_{i-1} - \alpha_{i-1} \quad (26)$$

$$F_i = \alpha_i F_0/180 = (^0P^1 - P_i^2)(\pi D_0^4/4)/\delta L_0 \quad (27)$$

$$P_i = [^0P^2 - \delta L_0 F_i/(\pi D_0^4/4)]^{0.5} = [P_{i-1}^2 \div (\delta L_{i,i-1} F_{i,i-1})/(\pi D_H^4/4)]^{0.5} \quad (28)$$

The flow rate $F_1$ of the first hole h1 with respect to the duct inner pressure $P_1$ below the first hole h1 is determined, and the angle $\alpha_1$ on one side of the exhaust region of the first hole h1 based on the flow rate $F_1$. The angle position $\theta_2$ of the second hole h2 is calculated based on the flow rate $F_1$ and the angle $\alpha_1$, and the flow rate $F_2$ of the second hole h2 is determined from the angle position $\theta_2$ and the angle $\alpha_1$. The angle $\alpha_2$ is then obtained from the flow rate $F_2$. The duct inner pressure $P_2$ of the second hole h2 is calculated as the functions of these elements. As for the third hole and the remaining holes, the same calculations are made so as to determine the variation of the angle positions of all the exhaust holes that are given a uniform exhaust flow rate per unit circumferential angle. The initial pressure $P_1$ is converted so that the total of the obtained flow rates satisfies the conditions of the process gas flow rates. Thus, the variation of the angle position $\theta_i$ of each hole can be obtained.

Figure 6:
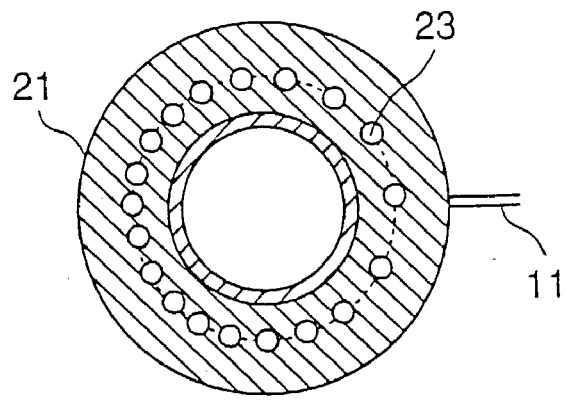
FIG. 6 shows the structure of the baffle plate of the first embodiment of the present invention.

FIG. 6 shows the baffle plate 21 of the first embodiment in which the baffle holes 23 are formed at the angle positions $\theta_1$ obtained in the above manner.

If the first hole h1 or the nth hole hn is located on the straight line between 0° and 180° on the pitch circle 19, a coefficient $c_1$ or $c_n$ mentioned later is 2. If the first hole h1 or the nth hole hn is not located on the straight line, the coefficient $c_1$ or $c_n$ mentioned later is 1. In a case where the total number m of holes is 72 and the coefficient $c_1$ of cn is 2, n is determined to be 37 by (m+2)/2. The total exhaust flow rate $F_0$ is determined as follows.

$$F_0 = 2(F_1/c_1 + F_2 + F_3 + \ldots + F_{n-1} + F_n/c_n) \quad (29)$$

In the following, eight aspects of the baffle plate 21 having baffle holes arranged at varied intervals so as to obtain uniform exhaust will be described.

(Standard Conditions)

Under the same process conditions as with the conventional baffle plate shown in FIG. 3, the uniform exhaust test was carried out with the baffle plate 21 having the baffle holes arranged at the optimum intervals on the pitch circle 19. The pore sizes were 2.5 mm, 3 mm, 4 mm, and 5 mm. The number of holes was 72. Table 2 shows the relationship between the optimum variation and the pore size between 0° to 180° of each hole.

TABLE 2

| ANGLE HOLE NUMBER | PORE SIZE | | | | HOLE NUMBER ANGLE | PORE SIZE | | | |
|---|---|---|---|---|---|---|---|---|---|
| | 2.5 mm | 3.0 mm | 4 mm | 5 mm | | 2.5 mm | 3.0 mm | 4 mm | 5 mm |
| 1 | 0.0 | 0.0 | 0.0 | 0.0 | | | | | |
| 2 | 6.6 | 8.4 | 16.6 | 32.9 | 20 | 104.7 | 113.3 | 135.9 | 154.9 |
| 3 | 13.0 | 16.5 | 30.7 | 55.9 | 21 | 109.4 | 117.6 | 139.1 | 156.8 |
| 4 | 19.3 | 24.1 | 43.0 | 73.0 | 22 | 114.0 | 121.9 | 142.1 | 158.7 |
| 5 | 25.4 | 31.3 | 53.7 | 86.2 | 23 | 118.6 | 126.1 | 145.1 | 160.4 |
| 6 | 31.4 | 38.3 | 63.2 | 96.7 | 24 | 123.2 | 130.2 | 147.9 | 162.1 |
| 7 | 37.3 | 44.9 | 71.6 | 105.3 | 25 | 127.7 | 134.3 | 150.7 | 163.7 |
| 8 | 43.0 | 51.3 | 79.2 | 112.6 | 26 | 132.1 | 138.3 | 153.4 | 165.2 |
| 9 | 48.7 | 57.4 | 86.1 | 118.7 | 27 | 136.6 | 142.2 | 156.0 | 166.7 |
| 10 | 54.2 | 63.3 | 92.4 | 124.1 | 28 | 141.0 | 146.1 | 158.8 | 168.2 |
| 11 | 59.6 | 69.0 | 98.2 | 128.7 | 29 | 145.4 | 150.0 | 161.1 | 169.6 |
| 12 | 64.9 | 74.5 | 103.6 | 132.8 | 30 | 149.8 | 153.8 | 163.5 | 171.0 |
| 13 | 70.2 | 79.9 | 108.5 | 136.5 | 31 | 154.1 | 157.6 | 166.0 | 172.3 |
| 14 | 75.3 | 85.0 | 113.1 | 139.9 | 32 | 158.5 | 161.4 | 168.3 | 173.6 |
| 15 | 80.4 | 90.0 | 117.5 | 142.9 | 33 | 162.8 | 165.1 | 170.7 | 174.9 |
| 16 | 85.4 | 94.9 | 121.6 | 145.7 | 34 | 167.1 | 168.9 | 173.0 | 176.2 |
| 17 | 90.3 | 99.7 | 125.4 | 148.2 | 35 | 171.4 | 172.6 | 175.4 | 177.5 |
| 18 | 95.1 | 104.3 | 129.1 | 150.6 | 36 | 175.7 | 176.3 | 177.7 | 178.7 |
| 19 | 99.9 | 108.8 | 132.6 | 152.8 | 37 | 180.0 | 180.0 | 180.0 | 180.0 |

As shown in Table 2, the interval between the first hole h1 and the second hole h2 is the largest with each pore size, while the interval between the 36th hole and the 37th hole on the 180° side becomes the smallest. Table 3 shows the relationship between the uniformity of the baffle plate having varied hole intervals and the process conditions.

TABLE 3

| COLUMN NUMBER | | 1-1 | | 1-2 | | 1-3 | | 1-4 | | 1-5 | |
|---|---|---|---|---|---|---|---|---|---|---|---|
| CHAMBER PRESSURE | Pa | 93.3 | | 133.3 | | 93.3 | | 93.3 | | 93.3 | |
| TOTAL GAS FLOW RATE | sccm | 1203 | | 1203 | | 601.5 | | 1203 | | 1203 | |
| TEMPERATURE | °C. | 520 | | 520 | | 520 | | 600 | | 520 | |
| GAS VISCOSITY | Pa·s | 3.63E − 05 | | 3.63E − 05 | | 3.63E − 05 | | 3.63E − 05 | | 1.5 × 3.63E − 05 | |
| PORE SIZE | mm | 3 | | 3 | | 3 | | 3 | | 3 | |
| DUCT EQUIVALENT DIAMETER | mm | 27.3 | | 27.3 | | 27.3 | | 27.3 | | 27.3 | |
| NUMBER of HOLES (ON THE ENTIRE CIRCUMFERENCE) | | 72 | | 72 | | 72 | | 72 | | 72 | |
| HOLE NUMBER | No. | 1 | 37 | 1 | 37 | 1 | 37 | 1 | 37 | 1 | 37 |
| HOLE INTERVALS | deg | 8.445 | 3.708 | 8.445 | 3.708 | 8.445 | 3.708 | 8.445 | 3.708 | 8.445 | 3.708 |
| DIFFERENTIAL SUCITON PRESSURE | Pa | 33.9 | 12.7 | 21.1 | 8.6 | 15.1 | 6.1 | 38.5 | 14.1 | 62.8 | 19.9 |
| DUCT INNER PRESSURE | Pa | 59.4 | 80.6 | 112.2 | 124.7 | 78.2 | 87.2 | 54.8 | 79.2 | 30.5 | 73.4 |
| FLOW RATE PER HOLE | sccm | 28.98 | 12.39 | 28.98 | 12.39 | 14.49 | 6.19 | 28.98 | 12.39 | 28.98 | 12.39 |
| FLOW RATE PER UNIT ANGLE | sccm | 3.342 | 3.342 | 3.342 | 3.342 | 1.671 | 1.671 | 3.342 | 3.342 | 3.342 | 3.342 |
| UNIFORMITY (m.m. METHOD) | % | 0.00% | | 0.00% | | 0.00% | | 0.00% | | 0.00% | |

The differential suction pressure shown in Table 3 indicates the difference between the inner pressure of the process chamber at each baffle hole 23 and the inner pressure of the exhaust duct.

The case of the 3-mm pore size in Table 2 corresponds to the column 1-1 in Table 3. In the case of the column 1-1, the maximum interval between the baffle holes 23 is 8.4 degrees between the first hole h1 and the second hole h2, and the minimum interval is 3.7 degrees between the 36th hole and the 37th hole. The maximum flow rate is 29 sccm at the first hole h1, and the minimum flow rate is 12.4 sccm at the 37th hole. The values obtained by dividing the flow rate of the baffle holes 23 by the angle 2 $\alpha_1$ and 2 $\alpha_{37}$ of the exhaust region with respect to each baffle hole 23 are equivalent to the flow rate per one degree shown in the column 1-1 in Table 3. The values are both 3.342 sccm. As for the other baffle holes 23 at the other positions, the flow rate of the exhaust gas of each hole is divided by the angle of the exhaust region, and the average exhaust flow rates per unit circumferential angle are the same. Thus, the uniformity value is 0%.

The positions of the baffle holes 23 are shown with circumferential angles in the range of 0° to 180°, with the position of the connecting port of the exhaust pipe 11 being the origin. The first hole h1 among the 72 holes on the pitch circle 19 is located at 0°, and the 37th hole is located at 180°. The second hole h2 to the 36th hole are located at the angles shown in Table 3, but the 38th to 72nd holes are located on the circumference on the opposite side of the origin, and arranged symmetrically with the locations of the second hole h2 to the 36th hole with respect to the line between 0° and 180°.

Also, in the case of the column 1-1 in Table 3, the duct inner pressure immediately below the first hole h1 is 59.4 Pa, which is slightly lower than the lowest duct inner pressure of 63.6 Pa in the case of a pore size of 3 mm shown in Table 1. However, the intervals between the baffle holes 7 in the conventional baffle plate 9 shown in FIG. 1 is uniform. On the other hand, the intervals between the baffle holes 23 in the baffle plate 21 of this embodiment varies in the range of 3.7 to 8.4 degrees as shown in the column 1-1 in Table 3, so that the variation of the exhaust flow rate per unit circumferential angle is averaged. As result, the uniformity approaches 0%. This proves that the uniformity is dramatically improved, compared with the conventional baffle plate shown in Table 1.

(Influence of Pressure Variations)

Using the baffle plate 21 of the first embodiment, the exhaust gas can be evenly distributed in the circumferential direction even of the chamber inner pressure varies. Under the same process conditions as shown in the column 1-1 in Table 3, except that the chamber inner pressure was 133.3 Pa, the locations of the 72 baffle holes each having a pore size of 3 mm were determined so that the exhaust from the chamber is distributed evenly in the circumferential direction. The results of this were exactly the same as the values in the case of the pore size of 3 mm shown in Table 2, as shown in the column 1-2 in Table 3. Accordingly, it was confirmed that the inner pressure of the gas process chamber had no adverse influence on the optimum hole intervals for uniform exhaust.

The lowest exhaust pressure immediately below the first hole h1 needs to be adjusted to 112.2 Pa, because the lowest exhaust pressure should correspond to a chamber pressure that is higher than the chamber pressure in the column 1-1 in Table 3. Thus, the inner pressure of the process chamber is maintained at 133.3 Pa.

(Influence of Flow Rate Variations)

Using the baffle plate shown in the column 1-1 in Table 3, the variation of the exhaust flow rate in the circumferential direction can be made uniform. Under the same process conditions as in the column 1-1 of Table 3, except that the total flow rate of the gas exhaust was 601.5 sccm, which is a half of the total flow rate in the column 1-1 of Table 3, the locations of the baffle holes required for uniform exhaust were determined. The results of this were exactly the same as the values in the case of the pore size of 3 mm shown in Table 2, as shown in the column 1-3 of Table 3. Accordingly, it was confirmed that the flow rate of the process gas had no adverse influence on the optimum hole intervals for uniform exhaust. However, the lowest exhaust pressure immediately below the first hole h1 needs to be adjusted to 78.2 Pa so as to accommodate an exhaust flow rate lower than that in the column 1-1 of Table 3. By doing so, the exhaust gas can be distributed evenly in the circumferential direction, while the chamber inner pressure is maintained at 93.3 Pa. The exhaust flow rate per unit circumferential angle is reduced as the amount of process gas decreases. However, it was found that the exhaust flow rate per unit circumferential angle is a constant value of 1.671 sccm, regardless of the locations of the holes.

(Influence of Temperature Variations)

Using the baffle plate shown in the column 1-1 of Table 3, the variation of the exhaust flow rate can be made uniform in the circumferential direction even if the process temperature varies. Under the same process conditions as in the column 1-1 of Table 3, except that the process gas temperature was 600° C., the locations of the baffle holes required for uniform exhaust were determined. The results of this were exactly the same as the values in the case of the pore size of 3 mm shown in Table 2, as shown in the column 1-4 of Table 3. Accordingly, it was confirmed that the process gas temperature had no adverse influence on the optimum hole intervals for uniform exhaust.

The lowest exhaust pressure immediately below the first hole h1 needs to be adjusted to 54.8 Pa, so as to accommodate an increased exhaust flow rate due to a higher temperature than in the column 1-1 of Table 3. By doing so, the exhaust gas can be distributed uniformly in the circumferential direction, while the chamber inner pressure is maintained at 93.3 Pa.

(Influence of Viscosity Variations)

Using the baffle plate shown in the column 1-1 of Table 3, it was found that the exhaust gas can be distributed uniformly in the circumferential direction even if the gas viscosity varies. Under the same process conditions as in the column 1-1 of Table 3, except that the gas viscosity is 5.44E−5Pa·s, which is 1.5 times as high as that in the column 1-1 of Table 3, the locations of the baffle holes were again determined so that the exhaust from the chamber can be distributed uniformly in the circumferential direction by the 72 baffle holes each having the pore size of 3 mm. The results of this were exactly the same as the values in the case of the pore size of 3 mm in Table 2, as shown in the column 1-5 of Table 3. Accordingly, it was confirmed that the process gas viscosity had no adverse influence on the optimum intervals for uniform exhaust.

However, the lowest exhaust pressure immediately below the first hole h1 needs to be adjusted to 30.5 Pa, so as to accommodate an increased gas viscosity that is higher than that in the column 1-1 of Table 3. By doing so, the exhaust gas can be distributed uniformly in the circumferential direction, while the chamber inner pressure is maintained at 93.3 Pa.

(Influence of Pore Size Variations)

Table 4 shows the relationship between the uniformity of the baffle plate having varied hole intervals and the conditions of fluid passages.

If a baffle plate having 72 holes each having a pore size of 2.5 mm, instead of 3 mm, the locations of the baffle holes required for uniform exhaust in the circumferential direction were determined. The results of this are shown in the column 1-6 of Table 4. The angle positions of the baffle holes are shown in the column of the pore size of 2.5 mm in Table 2.

Compared with the case of the pore size of 3 mm, the hole intervals of the 2.5-mm pore size holes exhibit higher uniformity. Since the differential suction pressure in the duct immediately below the first hole h1 is reduced to 20.4 Pa in the column 1-6 of Table 4, the differential pressure between the chamber pressure and the duct inner pressure due to higher fluid friction resistance with the smaller pore size. Accordingly, the differential pressure at each hole becomes higher. As a result, the influence of a variation of the duct inner pressure in the circumferential direction becomes relatively smaller, and the difference in exhaust flow rate due to the differential suction pressure between hole locations also becomes smaller. Thus, the intervals between the holes exhibit more uniformity.

In Table 2, the variations of exhaust are shown in the case of the pore sizes of 4 mm and 5 mm, as well as 2.5 mm and 3 mm. In accordance with Table 2, as the pore size becomes larger, the hole intervals on the first hole side become longer, while the hole intervals on the 180° side become shorter. However, it is obvious that each pore size should be smaller than the hole intervals.

(Influence of Variations in Duct Equivalent Diameter)

Using a baffle plate having the same number of holes with the same pore size as in the column 1-1 of Table 3, except that the equivalent diameter of the exhaust duct is enlarged from 27.3 mm to 34.3 mm, the locations of baffle holes were again determined so that uniform exhaust of exhaust gases of the same flow rate, the same pressure, and the same temperature can be obtained in the circumferential direction. The results of this are shown in the column 1-7 of Table 4.

Since the fluid friction resistance in a wider duct is smaller, the differential pressure required for drawing gas from the chamber into the duct becomes more uniform. As a result, the intervals between the baffle holes for obtaining uniform exhaust per unit angle in the circumferential direction also become more uniform than in the case of the column 1-1 of Table 3.

TABLE 4

| COLUMN NUMBER | | 1-1 | | 1-6 | | 1-7 | | 1-8 | |
|---|---|---|---|---|---|---|---|---|---|
| CHAMBER PRESSURE | Pa | 93.3 | | 93.3 | | 93.3 | | 93.3 | |
| TOTAL GAS FLOW RATE | sccm | 1203 | | 1203 | | 1203 | | 1203 | |
| TEMPERATURE | ° C. | 520 | | 520 | | 520 | | 600 | |
| GAS VISCOSITY | Pa·s | 3.63E − 05 | | 3.63E − 05 | | 3.63E − 05 | | 3.63E − 05 | |
| PORE SIZE | mm | 3 | | 2.5 | | 3 | | 3 | |
| DUCT EQUIVALENT DIAMETER | mm | 27.3 | | 27.3 | | 34.3 | | 27.3 | |
| NUMBER of HOLES (ON THE ENTIRE CIRCUMFERENCE) | | 72 | | 72 | | 72 | | 72 | |
| HOLE NUMBER | No. | 1 | 37 | 1 | 37 | 1 | 37 | 1 | 37 |
| HOLE INTERVALS | deg | 8.445 | 3.708 | 6.603 | 4.295 | 6.322 | 4.403 | 11.085 | 6.420 |
| DIFFERENTIAL SUCITON PRESSURE | Pa | 33.9 | 12.7 | 72.9 | 35.1 | 23.4 | 15.3 | 49.6 | 28.8 |
| DUCT INNER PRESSURE | Pa | 59.4 | 80.6 | 20.4 | 58.2 | 69.9 | 78.0 | 43.7 | 64.5 |
| FLOW RATE PER HOLE | sccm | 28.98 | 12.39 | 22.35 | 14.35 | 21.35 | 14.71 | 38.03 | 25.44 |
| FLOW RATE PER UNIT ANGLE | sccm | 3.342 | 3.342 | 3.342 | 3.342 | 3.342 | 3.342 | 3.342 | 3.342 |
| UNIFORMITY (m.m. METHOD) | % | 0.00% | | 0.00% | | 0.00% | | 0.00% | |

(Influence of Variations in Hole Number)

Under the same conditions as in the column 1-1 of Table 3, except that the number of baffle holes is 47 instead of 72, the locations of the baffle holes required for obtaining uniform exhaust in the circumferential direction were determined. The results of this are shown in the column 1-8 of Table 4. The angle locations of the baffle holes can be determined in the same manner as described so far.

As the number of holes decreases, the maximum hole intervals and the minimum hole intervals both increase, and the flow rate of each hole also becomes higher. However, the exhaust flow rate per unit circumferential angle is constantly 3.342 sccm, regardless of the locations of the holes. From this fact, it becomes apparent that the technique of obtaining uniform exhaust by varying the hole intervals can be applied to a case in which the number of holes varies.

Second Embodiment

A second embodiment of the present invention shows a case where a porous baffle plate has baffle holes arranged at uniform intervals and having different pore sizes for obtaining uniform exhaust. In this porous baffle plate, the hole intervals and the thickness are uniform, but the pore sizes are varied so that a uniform exhaust flow rate can be maintained in the circumferential direction.

Figure 7:
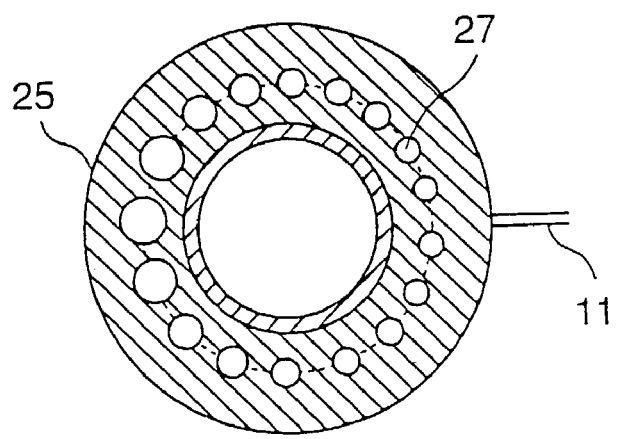
FIG. 7 shows the structure of a baffle plate of a second embodiment of the present invention.

FIG. 7 shows the structure of the baffle plate of the second embodiment of the present invention. As shown in FIG. 7, the pore size is smaller on the downstream side in the vicinity of the connecting port of the exhaust pipe 11, so as to restrict an increase of the exhaust flow rate of each hole due to an excessive differential suction pressure. In order to obtain a uniform flow rate, the pore sizes are designed in the following manner.

A method of determining the optimum pore size variation of m baffle holes 27 arranged on the pitch circle 19 at uniform intervals will now be described. The exhaust flow rate per hole is the average flow rate, i.e., $F_m = F_0/m$. The pore size $D_1$ of the hole located at the most downstream side is arbitrarily given as the minimum design pore size, so that the other pore sizes can be determined from the relationship described below.

The relationship between the pore size $D_1$ and the flow rate $F_1$ of the first hole can be expressed by the differential pressure $\Delta^0 P_1 (= {}^0P - P_1)$ between the duct inner pressure $P_1$ and the chamber pressure ${}^0P$ as follows.

$$F_1 = ({}^0P^2 - P_1^2)\{(\pi/4)D_1^4\}/\delta L_0 = F_m = F_0/m \quad (30)$$

From the above equation, the duct inner pressure can be determined by the following equation (31).

$$P_1 = \{{}^0P^2 - \delta L_0 F_0/(\pi m D_1^4/4)\}^{0.5} \quad (31)$$

The duct inner pressure $P_2$ immediately below the second hole is higher than the duct inner pressure $P_1$ by the differential pressure $\Delta P_{2,1}$, and can be determined by the relationship with the mass velocity $G_{2,1}$ ($=F_{2,1}$ (1E-6/60)(M/0.0224)/(($\pi$/4)$D_H^2$)) of the gas $F_{2,1}$ ($=(F_0-F_1)/2$) flowing the distance of the duct length $L_m$ ($=2\pi r/m$).

$$P_2 = [P_1^2 + \{\delta L_m(F_0/2 - F_1/2)/\{(\pi/4)D_H^4\}]^{0.5} \quad (32)$$

From this equation, the pore size $D_2$ having the flow rate $F_2$ of the second hole as the uniform flow rate $F_m$ can be obtained. As for the other baffle holes, the pore sizes are determined in the same manner.

$$F_2 = ({}^0P^2 - P_2^2)\{(\pi/4)D_2^4\}/\delta L_0 = F_0/m \quad (33)$$

$$D_2 = [\delta L_0 F_0/\{(\pi m/4){}^0P^2 - P_2^2)\}]^{1/4} \quad (34)$$

As for the ith hole, the following equations hold.

$$P_i = [{}^0P^2 \delta L_0 F_i/\{(\pi/4)D_i^4\}]^{0.5} \quad (35)$$

$$P_i = [P_{i-1}^2 + \{\delta L_m(F_0/2 - F_1/2 - F_2 - \ldots - F_{i-1})/\{(\pi/4)D_H^4\}]^{0.5} \quad (36)$$

$$F_i = ({}^0P^2 - P_i^2)\{(\pi/4)D_i^4\}/\delta L_0 = F_0/m \quad (37)$$

$$D_i = [\delta L_0 F_0/\{(\pi m/4)({}^0P^2 - P_i^2)\}]^{1/4} \quad (38)$$

The relational expression (36) with respect to i and i–i is then substituted in the equation (35) as follows.

$$[{}^0P^2 - \delta L_0 F_i/\{(\pi/4)D_i^4\}]^{0.5} = [{}^0P^2 - \delta L_0 F_{i-1}/\{(\pi/4)D_{i-1}^4\} + \{\delta L_m(F_0/2 - F_1/2 - F_2 - \ldots - F_{i-1})/\{(\pi/4)D_H^4\}]^{0.5} \quad (39)$$

By arranging this equation, the following equation (40) is obtained.

$$D_i^4/D_{i-1}^4 - \{(2\pi r/mL_0)\{(F_0/2 - F_1/2 - F_2 - \ldots - F_{i-1})/F_{i-1}\}(D_i^4/D_H^4) = F_i/F_{i-1} \quad (40)$$

When the flow rates of the holes are uniform, the right-hand side of the equation (40) becomes 1. Accordingly, the following equations hold.

$$D_i^4/D_{i-1}^4 - \{(\pi r/mL_0)(m+3-2i)(D_i^4/D_H^4) = 1 \quad (41)$$

$$D_i^4[1/D_{i-1}^4\{(\pi r/mL_0 D_H^4)(m+3-2i)\}] = 1 \quad (42)$$

$$D_i = 1/[1/D_{i-1}^4 - \{(\pi r/mL_0 D_H^4)(m+3-2i)\}]^{1/4} \quad (43)$$

When the pore size of each hole satisfies the relational expression (43), the flow rates of the holes are apparently uniform.

As described above, the diameter of each of the baffle holes 27 arranged at uniform intervals can be determined by the equation (43). Accordingly, it became apparent that the pore size of each baffle hole 27 depends on only the number m of holes, the plate thickness $L_0$, the pitch circle radius r, and the duct effective diameter $D_H$, but not on the total flow rate $F_0$, the chamber pressure ${}^0P$, the temperature T, and the viscosity. The diameter $D_1$ of the first hole is given as the reference value, so that the duct inner pressure $P_1$ to maintain the chamber pressure ${}^0P$ with respect to the total flow rate $F_0$ can be calculated by the equation (31). The duct inner pressure $P_1$ thus obtained is important to adjust the pressure of the exhaust system.

Table 5 shows the relationship between the pore size and the suction pressure in the exhaust baffle plate 25 having the baffle holes having different diameters.

TABLE 5

| COLUMN NUMBER | | 2-1 | | 2-2 | | 2-3 | | 2-4 | |
|---|---|---|---|---|---|---|---|---|---|
| CHAMBER PRESSURE | Pa | 93.3 | | ← | | ← | | ← | |
| TOTAL GAS FLOW RATE | sccm | 1203 | | ← | | ← | | ← | |
| TEMPERATURE | °C. | 520 | | ← | | ← | | ← | |
| GAS VISCOSITY | Pa·s | 3.63E−05 | | ← | | ← | | ← | |
| HOLE INTERVALS | | UNIFORM | | ← | | ← | | ← | |
| NUMBER of HOLES (ON THE ENTIRE CIRCUMFERENCE) | | 72 | | ← | | ← | | ← | |
| BAFFLE PLATE THICKNESS | mm | 1 | | ← | | ← | | ← | |
| DUCT EQUIVALENT DIAMETER | mm | 27.3 | | ← | | ← | | ← | |
| PITCH CIRCLE DIAMETER | mm | 240 | | ← | | ← | | ← | |
| | | SMALLEST HOLE | LARGEST HOLE | SMALLEST HOLE | LARGEST HOLE | SMALLEST HOLE | LARGEST HOLE | SMALLEST HOLE | LARGEST HOLE |
| DORE SIZE D: | mm | 2.30 | 2.56 | 2.40 | 2.73 | 2.50 | 2.94 | 2.60 | 3.19 |
| DIFFERENTIAL SUCITON PRESSURE ΔOPI | Pa | 85.5 | 38.3 | 55.8 | 27.1 | 43.2 | 19.3 | 34.9 | 13.4 |
| DUCT INNER PRESSURE Pi | Pa | 7.8 | 55.1 | 37.6 | 66.2 | 50.1 | 74.0 | 58.4 | 79.9 |
| FLOW RATE PER HOLE Fi | sccm | 16.7 | 16.7 | 16.7 | 16.7 | 16.7 | 16.7 | 16.7 | 16.7 |
| UNIFORMITY (m.m. METHOD) | % | 0.00% | | 0.00% | | 0.00% | | 0.00% | |

| COLUMN NUMBER | | 2-5 | | 2-6 | |
|---|---|---|---|---|---|
| CHAMBER PRESSURE | Pa | ← | | ← | |
| TOTAL GAS FLOW RATE | sccm | ← | | ← | |
| TEMPERATURE | °C. | ← | | ← | |
| GAS VISCOSITY | Pa·s | ← | | ← | |
| HOLE INTERVALS | | ← | | ← | |
| NUMBER of HOLES (ON THE ENTIRE CIRCUMFERENCE) | | ← | | ← | |
| BAFFLE PLATE THICKNESS | mm | ← | | ← | |
| DUCT EQUIVALENT DIAMETER | mm | ← | | ← | |
| PITCH CIRCLE DIAMETER | mm | ← | | ← | |
| | | SMALLEST HOLE | LARGEST HOLE | SMALLEST HOLE | LARGEST HOLE |
| DORE SIZE D: | mm | 2.80 | 3.97 | 3.00 | 10.52 |
| DIFFERENTIAL SUCITON PRESSURE ΔOPI | Pa | 24.3 | 5.4 | 17.7 | 0.1 |
| DUCT INNER PRESSURE Pi | Pa | 69.1 | 88.0 | 69.1 | 88 |
| FLOW RATE PER HOLE Fi | sccm | 16.7 | 16.7 | 75.6 | 16.7 |
| UNIFORMITY (m.m. METHOD) | % | 0.00% | | 0.00% | |

Table 5 shows data concerning the porous baffle plate provided with baffle holes 27 that are arranged at uniform intervals on the pitch circle and have various diameters, under the same process conditions as the process conditions in obtaining the data shown in Table 1. In Table 5, only the maximum pore size and the minimum pore size among the 72 baffle holes formed in the baffle plate are shown. However, the other holes are formed to satisfy the equation (43).

The columns 2-1 to 2-6 of Table 5 shows the results of experiments on the minimum pore size in the range of 2.3 mm to 3 mm of the baffle holes 27. From these results, it is confirmed that the exhaust flow rate per hole is the same regardless of the pore size.

Also, the differential pressure between the two sides of each baffle hole 27 becomes larger, as the pore size becomes smaller. However, in the column 2-1 of Table, the minimum pore size is 2.3 mm, while the maximum pore size is only 2.56 mm. Accordingly, it is not necessary to vary the pore sizes in a wide range. In this case, however, it is necessary to reduce the inner pressure of the first hole to 7.8 Pa, which is close to 6.67 Pa, the limit of the suction pressure. In a case where the baffle plate 25 is employed, the gas flow load cannot be increased any further. Meanwhile, in the case of the column 2-6 of Table 5, the minimum pore size is 3 mm, while the maximum pore size needs to be as large as 10.5 mm. This maximum pore size is almost the same as the average hole interval (240 π/72=10.47 mm), and also the upper limit of the pore size. The duct inner pressure below the baffle hole 27 having the largest pore size is almost as large as 93.3 Pa, which is equivalent to the inner pressure of the process chamber. Also, the variation of the pore size is a limit, since a uniform suction operation is performed at a very small differential pressure via the baffle hole 27 having the largest pore size. In these experiments, the baffle plate 25 having the pore size variation shown in the columns 2-2 to 2-5 in Table 5. As described above, in order to obtain uniform exhaust under desired process conditions, various pore size variations may exist for a porous baffle plate having a desired number of baffle holes arranged at uniform intervals and a desired thickness. These variations can be easily embodied by the above relational expressions in accordance with the present invention. Furthermore, the baffle plate 25 having the optimum pore size variation for the conditions of the actual processing apparatus.

Table 6 shows that the exhaust uniformity in the baffle plate 25 having a fixed pore size variation does not depend on the process conditions.

TABLE 6

| COLUMN NUMBER | | 2-4 | | 2-7 | | 2-8 | | 2-9 | |
|---|---|---|---|---|---|---|---|---|---|
| CHAMBER PRESSURE | Pa | 93.3 | | 133.3 | | 93.3 | | 93.3 | |
| TOTAL GAS FLOW RATE | sccm | 1203 | | 1203 | | 600 | | 900 | |
| TEMPERATURE | ° C. | 520 | | 520 | | 520 | | 520 | |
| GAS VISCOSITY | Pa · s | 3.63E − 05 | | 3.63E − 05 | | 3.63E − 05 | | 3.63E − 05 | |
| HOLE INTERVALS | | UNIFORM | | UNIFORM | | UNIFORM | | UNIFORM | |
| NUMBER of HOLES (ON THE ENTIRE CIRCUMFERENCE) | | 72 | | 72 | | 72 | | 72 | |
| BAFFLE PLATE THICKNESS | mm | 1 | | 3 | | 3 | | 3 | |
| DUCT EQUIVALENT DIAMETER | mm | 27.3 | | 27.3 | | 27.3 | | 27.3 | |
| PITCH CIRCLE DIAMETER | mm | 240 | | 240 | | 240 | | 240 | |
| | | SMALLEST HOLE | LARGEST HOLE | SMALLEST HOLE | LARGEST HOLE | SMALLEST HOLE | LARGEST HOLE | SMALLEST HOLE | LARGEST HOLE |
| DORE SIZE D: | mm | 2.60 | 3.19 | 2.60 | 3.19 | 2.60 | 3.19 | 2.60 | 3.19 |
| DIFFERENTIAL SUCITON PRESSURE Δ ° Pi | Pa | 34.9 | 13.4 | 21.6 | 9.0 | 15.4 | 6.4 | 24.4 | 9.9 |
| DUCT INNER PRESSURE Pi | Pa | 58.4 | 79.9 | 111.7 | 124.3 | 77.9 | 86.9 | 68.9 | 83.5 |
| FLOW RATE PER HOLE Fi | sccm | 16.7 | 16.7 | 16.7 | 16.7 | 8.33 | 8.33 | 12.5 | 12.5 |
| UNIFORMITY (m.m. METHOD) | % | 0.00% | | 0.00% | | 0.00% | | 0.00% | |

| COLUMN NUMBER | | 2-10 | | 2-11 | |
|---|---|---|---|---|---|
| CHAMBER PRESSURE | Pa | 93.3 | | 93.3 | |
| TOTAL GAS FLOW RATE | sccm | 1200 | | 1800 | |
| TEMPERATURE | ° C. | 520 | | 520 | |
| GAS VISCOSITY | Pa · s | 3.63E − 05 | | 3.63E − 05 | |
| HOLE INTERVALS | | UNIFORM | | UNIFORM | |
| NUMBER of HOLES (ON THE ENTIRE CIRCUMFERENCE) | | 72 | | 72 | |
| BAFFLE PLATE THICKNESS | mm | 3 | | 3 | |
| DUCT EQUIVALENT DIAMETER | mm | 27.3 | | 27.3 | |
| PITCH CIRCLE DIAMETER | mm | 240 | | 240 | |
| | | SMALLEST HOLE | LARGEST HOLE | SMALLEST HOLE | LARGEST HOLE |
| DORE SIZE D: | mm | 2.60 | 3.19 | 2.60 | 3.19 |
| DIFFERENTIAL SUCITON PRESSURE Δ ° Pi | Pa | 34.8 | 13.4 | 65.4 | 21.0 |
| DUCT INNER PRESSURE Pi | Pa | 58.5 | 79.9 | 28.0 | 7.23 |
| FLOW RATE PER HOLE Fi | sccm | 16.7 | 16.7 | 25.0 | 25.0 |
| UNIFORMITY (m.m. METHOD) | % | 0.00% | | 0.00% | |

Table 6 shows that a change in the process conditions has no influence on the optimum pore size variation in a baffle plate having a minimum pore size of 2.6 mm (shown in the column 2-4 of Table 5). More specifically, the flow rates at the baffle hole having the minimum pore size and at the baffle hole having the maximum pore size show that the exhaust flow rate at each of the baffle holes can be uniformly maintained by simply adjusting the exhaust duct inner pressure $P_i$ under the first hole with a change of the process pressure from 93.3 Pa to 133.3 Pa as shown in the column 2-7 of Table 6 and a change of the flow load from 600 sccm to 1800 sccm as shown in the columns 2-8 to 2-11 of Table 6.

As can be seen from Table 6, the baffle plate 25 provided with the baffle holes 27 having different pore sizes from each other is more advantageous than the baffle plate 9 having uniform-size baffle holes at uniform intervals shown in Table 1. With the baffle plate 9 shown in Table 1, even if each pore size is 2.444 mm, which makes the differential suction pressure so large as to reach the limit of the exhaust capacity, the exhaust uniformity cannot exceed 19.0%. With the baffle plate 25 having the optimum pore size variation, on the other hand, uniform exhaust can be constantly obtained in a range in which the duct inner pressure can be adjusted.

In a case where the pore size of a baffle hole 27 is too small, the differential pressure of the baffle hole 27 increases to restrict the process gas flow rate and the freedom of the control valves used for pressure control in processes. On the other hand, in a case where the pore size of each baffle hole 27 is too small, the inner pressure in a duct far away from the connecting port of the exhaust pipe 11 becomes substantially the same as the chamber inner pressure, resulting in undesired exhaust. Accordingly, in order to obtain uniform exhaust, a baffle plate 25 having the optimum pore size variation needs to be selected. This should be easily achieved by the method in accordance with the present invention.

Figure 8:
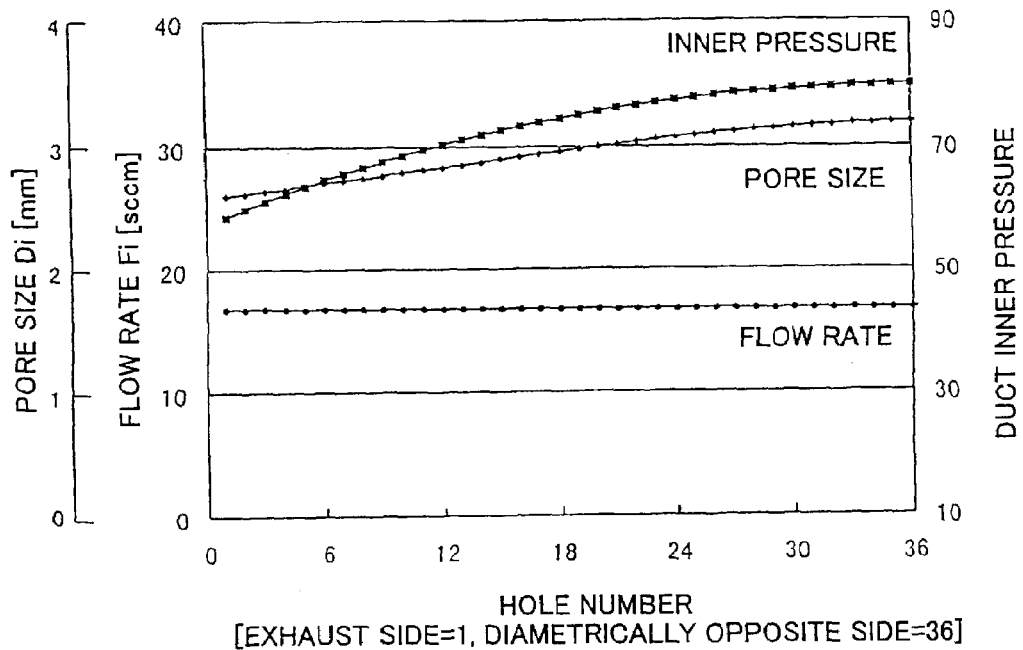
FIG. 8 is a graph showing the characteristics of the baffle plate provided with baffle holes having different pore sizes from each other in accordance with the second embodiment of the present invention.

FIG. 8 is a graph showing the characteristics of the baffle plate 25 of the second embodiment provided with the baffle holes having different pore sizes from each other. The graph is the results of a simulation in which the total number of holes on a predetermined circumference was 72, the hole intervals are uniform, the duct radius was 120 mm, the long side of the duct section was 30 mm, the short side of the duct section was 24 mm, the thickness of the baffle plate was 1 mm, the chamber pressure was 93.3 Pa, the gas amount was 1203 sccm, the temperature was 520° C., the average molecular weight was 59.6 g/mol, and the gas viscosity was 3.625E−5 Pa·sec.

As shown in FIG. 8, if the first baffle hole 27 (number 1) is formed immediately above the connecting port of the exhaust pipe 11 in the baffle plate 25 of the second embodiment of the present invention, the pore size $D_i$ increases along the semicircle toward the 37th baffle hole 27 formed on the upstream side. As shown in FIG. 8, in this baffle plate 25, the change of the duct inner pressure $P_i$ [Pa] with the hole number is similar to the change with pore size. The duct inner pressure $P_1$ [Pa] increases from the first baffle hole to the 37th baffle hole. The flow rate $F_i$ [sccm] is constant, regardless of the location of the, as shown in FIG. 8.

Figure 9:
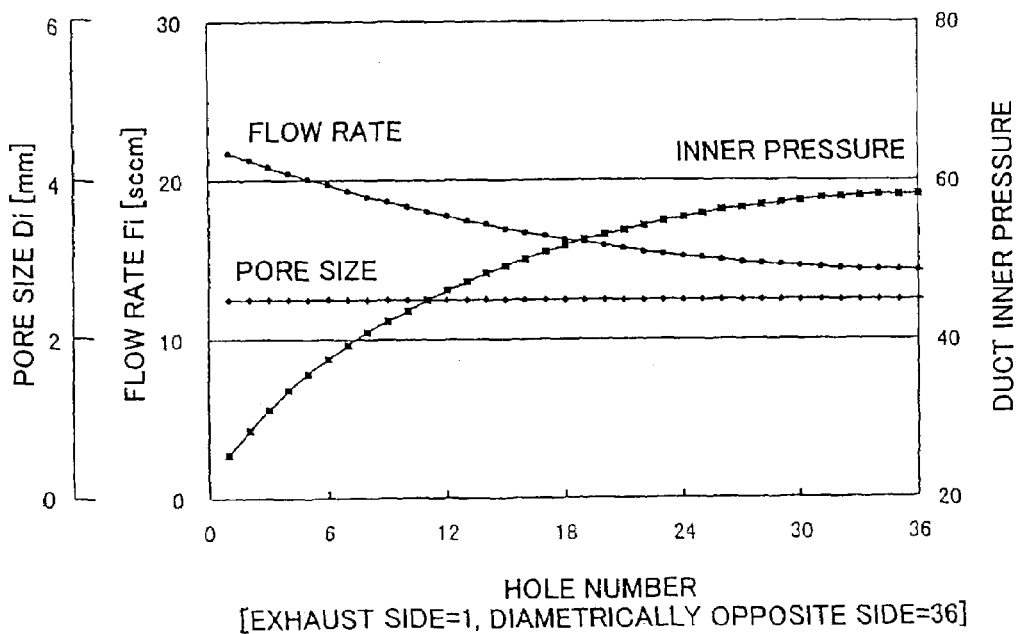
FIG. 9 is a graph showing the results of a simulation performed on the conventional baffle plate shown in FIG. 3 under the same conditions as in the case shown in FIG. 8.

FIG. 9 is a graph showing the results of a simulation performed on the conventional baffle plate 9 shown in FIG. 3 under the same conditions as in the case shown in FIG. 8. As shown in FIG. 9, the baffle plate 9 has baffle holes 7 having uniform pore sizes. The duct inner pressure has a larger increase rate with the hole number, compared with the baffle plate 25 of the second embodiment. The flow rate of the gas flowing through the first to 37th baffle holes 7 forms a decreasing function with the hole number. Accordingly, the flow rate varies from the location of the baffle hole corresponding to the exhaust outlet, and uniform exhaust cannot be realized.

Figure 10:
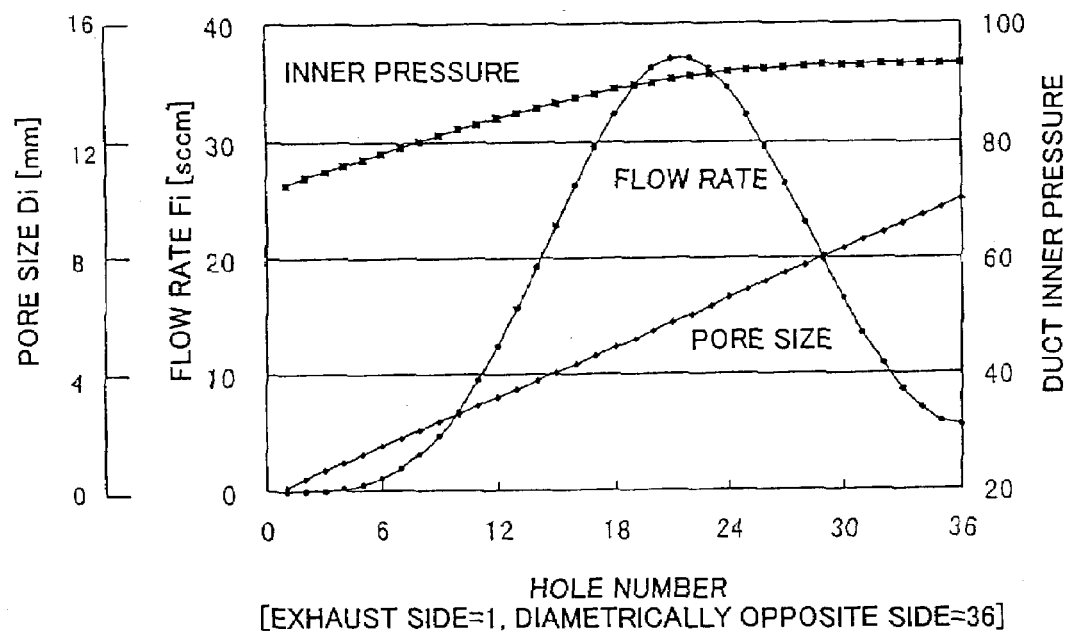
FIG. 10 is a graph showing the results of a simulation performed on a conventional baffle plate disclosed in Japanese Laid-Open Patent Application No. 63-141318.

FIG. 10 is a graph showing the results of a simulation performed on a conventional baffle plate disclosed in Japanese Laid-Open Patent Application No. 63-141318 under the same conditions as in the case shown in FIG. 8. As shown in FIG. 10, in this baffle plate, the pore size of a baffle hole is proportional to the hole number, i.e., the distance from the exhaust outlet. Also as shown in FIG. 10, the flow rate drastically varies at the location around the 20th hole, which proves that the flow rate uniformity is very poor in the circumferential direction of the baffle plate.

Third Embodiment

A third embodiment of the present invention is a porous baffle plate provided with the uniform-diameter baffle holes formed at uniform intervals. In this baffle plate, the hole intervals and the pore sizes are all uniform, but the length of the holes, i.e., the plate thickness is varied in such a manner that can maintain a uniform average exhaust flow rate in the circumferential direction.

Figure 11:
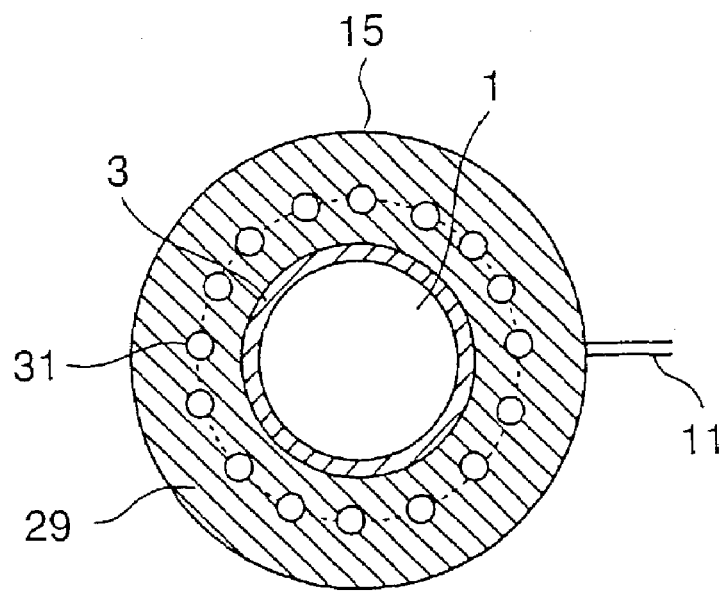
FIG. 11 shows the structure of a baffle plate of a third embodiment of the present invention.
Figure 12:
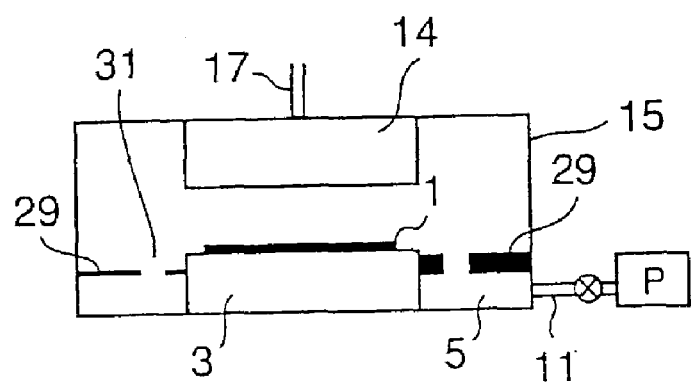
FIG. 12 shows the structure of a gas process chamber on which the baffle plate shown in FIG. 11 is mounted.

FIG. 11 shows the structure of a baffle plate 29 of the third embodiment of the present invention. FIG. 12 shows the structure of a gas process chamber on which the baffle plate 29 of this embodiment is mounted. As shown in FIG. 12, the baffle plate 29 has a greater thickness in the vicinity of the connecting port of the exhaust pipe 11 so as to restrict an increase in exhaust flow rate per hole due to an excessive differential suction pressure, thereby reducing a conductance by the gas flow. At the upstream side of the gas flow, where the differential suction pressure decreases, the baffle plate 29 has a smaller thickness so as to increase the conductance, thereby obtaining a uniform exhaust flow rate.

The length of each baffle hole 31 and the thickness of the baffle plate 29 required for obtaining the uniform exhaust flow rate are determined in the following manner.

The optimum thickness variation of the baffle plate 29 can be obtained by the relational expression in accordance with the second embodiment of the present invention, with the length $L_0$ of the ith baffle hole 31 being $L_i$ and the pore size $D_i$ being $D_0$.

$$P_i = [^0P^2 - \delta L_i F_i / \{(\pi/4)D_0^4\}]^{0.5} \quad (44)$$

$$P_i = [P_{i-1}^2 + \delta L_m(F_0/2 - F_1/2 - F_2 - \ldots - F_{i-1})/\{(\pi/4)D_H^4\}]^{0.5} \quad (45)$$

$$F_i = (^0P^2 P_i^2)\{(\pi/4)D_0^4\}/\delta L_i = F_0/m \quad (46)$$

$$D_0 = [\delta L_i F_0 / \{(\pi m/4)(^0P^2 - P_i^2)\}]^{1/4} \quad (47)$$

Here, the above equation (44) is substituted in the equation (45) to obtain the following equation.

$$[^0P^2 - \delta L_i F_i / \{(\pi/4)D_0^4\}]^{0.5} = \quad (48)$$
$$[^0P^2 - \delta L_{i+1} F_{i+1} / \{(\pi/4)D_0^4\} + \delta L_m(F_0/2 - F_1/2 - F_2 - \ldots - F_{i-1})/\{(\pi/4)D_H^4\}]^{0.5}$$

Since the flow rates of the baffle holes 31 are equal to each other, i.e., $F_{i-1}/F_i = 1$, and a hole interval $L_m$ is $2\pi r/m$, the length $L_i$ of the ith baffle hole 31 can be determined as follows.

$$L_i = L_{i-1} - L_m(D_0/D_H)^4(F_0/2F_i + F_1/2F_i - F_1/F_i - \quad (49)$$
$$F_2/F_i - \cdots - F_{i-1}/F_i)$$
$$= L_{i-1} - (2\pi r/m)(D_0/D_H)^4\{m/2 + 1/2 - (1 + 1 + \cdots + 1)\}$$
$$= L_{i-1} - (\pi r/m)(D_0/D_H)^4(m + 3 - 2i)$$
$$= L_1 - (\pi r/m)(D_0/D_H)^4\{(m-1) + (m-3) +$$
$$(m-5) + \cdots + (m + 3 - 2i)\}$$
$$= L_1 - (\pi r/m)(D_0/D_H)^4(i-1)(m - i + 1).$$

If the angle position of the first hole on the pitch circle in the vicinity of the connecting port of the exhaust pipe 11 is 0°, and the angle position of the n the hole that is the farthest away from the connecting port is 180°, the relationship between n and the total hole number m can be expressed as n=(m+2)/2, and the plate thickness $L_n$ of the thinnest nth hole can be expressed as follows.

$$L_n = L_1 - \pi r(D_0/D_H)^4(m^2 - 4)/4m \quad (50)$$

Since the allowable range of $L_1$ and $L_n$ should be the minimum suction pressure P* or larger, the following equations hold.

$$P_1 = [^0P^2 - \delta L_1 F_1 / \{(\pi/4)D_0^4\}]^{0.5} > P^* \quad (51)$$

$$L_1 < (^0P^2 - P^{*2})(\pi m/4)D_0^4/\delta F_0 \quad (52)$$

$$P_1 = [^0P^2 - \delta F_1\{L_n + \pi r(D_0/D_H)^4(m^2 - 4)/4m\}/\{(\pi/4)D_0^4\}]^{0.5} > P^* \quad (53)$$

$$L_n < (\pi m/4)(D_0 D_H)^4\{(^0P^2 - P^{*2})D_H^4/\delta F_0 - r(1 - 4/m^2)\} \quad (54)$$

The allowable range of pore sizes can be obtained by the following equation, which is obtained by substituting an arbitrarily selected $L_n$ in the above equation (54).

$$D_0 > [L_n/[(\pi m/4)\{(^0P^2 - P^{*2})/\delta F_0 - r(1 - 4/m^2)/D_H^4\}]]^{1/4} \quad (55)$$

As described so far, the optimum thickness variation of the baffle plate for realizing uniform exhaust is determined by the equation (49). However, it is necessary to employ the restrictive conditions of the equations (52), (54), and (55) based on the limit of the lowest suction pressure P* and the chamber pressure $^0P$.

Now, influences of the pore sizes of the baffle holes on the optimum plate thickness variation are shown in Table 7 and Table 8.

TABLE 7

| COLUMN NUMBER | | 3-1 | 3-2 | 3-3 | 3-4 | 3-5 |
|---|---|---|---|---|---|---|
| CHAMBER PRESSURE | Pa | 93.3 | 93.3 | 93.3 | 93.3 | 93.3 |
| TOTAL GAS FLOW RATE | sccm | 1203 | 1203 | 1203 | 1203 | 1203 |
| TEMPERATURE | °C. | 520 | 520 | 520 | 520 | 520 |
| GAS VISCOSITY | Pa·s | 3.63E−05 | 3.63E−05 | 3.63E−05 | 3.63E−05 | 3.63E−05 |
| PORE SIZE | mm | 2.55 | 3.00 | 4.00 | 5.00 | 6.00 |
| DUCT EQUIVALENT DIAMETER | mm | 27.3 | 27.3 | 27.3 | 27.3 | 27.3 |
| NUMBER of HOLES (ON THE ENTIRE CIRCUMFERENCE) | | 72 | 72 | 72 | 72 | 72 |
| HOLE NUMBER I | No. | 1    37 | 1    37 | 1    37 | 1    37 | 1    37 |
| PLATE THICKNESS Li | mm | 1.52  1 | 1.99  1 | 4.14  1 | 8.67  1 | 16.9  1 |
| DIFFERENTIAL SUCITON PRESSURE Δ°Pi | Pa | 89.9  38.7 | 40.9  17.7 | 24.1  5.2 | 20.2  2.1 | 18.8  1.0 |
| DUCT INNER PRESSURE Pi | sccm | 3.4  54.6 | 52.4  75.6 | 69.2  88.1 | 73.2  91.2 | 74.5  92.3 |
| FLOW RATE PER HOLE Fi | sccm | 16.71  16.71 | 16.71  16.71 | 16.71  16.71 | 16.71  16.71 | 16.71  16.71 |
| UNIFORMITY (m.m. METHOD) | % | 0.00% | 0.00% | 0.00% | 0.00% | 0.00% |

TABLE 8

| COLUMN NUMBER | 3-1 | 3-2 | 3-3 | 3-4 | 3-5 | COLUMN NUMBER | 3-1 | 3-2 | 3-3 | 3-4 | 3-5 |
|---|---|---|---|---|---|---|---|---|---|---|---|
| HOLE | PORE SIZE (mm) | | | | | HOLE | PORE SIZE (mm) | | | | |
| NUMBER | 2.55 | 3 | 4 | 5 | 6 | NUMBER | 2.55 | 3 | 4 | 5 | 6 |
| 1 | 1.52 | 1.99 | 4.14 | 8.67 | 16.9 | 19 | 1.13 | 1.25 | 1.79 | 2.92 | 5.0 |
| 2 | 1.49 | 1.94 | 3.97 | 8.25 | 16.0 | 20 | 1.12 | 1.22 | 1.70 | 2.71 | 4.5 |
| 3 | 1.46 | 1.89 | 3.80 | 7.84 | 15.2 | 21 | 1.10 | 1.20 | 1.62 | 2.51 | 4.1 |
| 4 | 1.44 | 1.84 | 3.64 | 7.44 | 14.4 | 22 | 1.09 | 1.17 | 1.55 | 2.33 | 3.8 |
| 5 | 1.41 | 1.79 | 3.48 | 7.06 | 13.6 | 23 | 1.08 | 1.15 | 1.47 | 2.16 | 3.4 |
| 6 | 1.38 | 1.74 | 3.33 | 6.68 | 12.8 | 24 | 1.07 | 1.13 | 1.41 | 2.00 | 3.1 |
| 7 | 1.36 | 1.69 | 3.18 | 6.32 | 12.0 | 25 | 1.06 | 1.11 | 1.35 | 1.85 | 2.8 |
| 8 | 1.34 | 1.65 | 3.04 | 5.97 | 11.3 | 26 | 1.05 | 1.09 | 1.29 | 1.72 | 2.5 |
| 9 | 1.31 | 1.60 | 2.90 | 5.64 | 10.6 | 27 | 1.04 | 1.08 | 1.24 | 1.59 | 2.2 |
| 10 | 1.29 | 1.56 | 2.77 | 5.31 | 9.9 | 28 | 1.03 | 1.06 | 1.20 | 1.48 | 2.00 |
| 11 | 1.27 | 1.52 | 2.64 | 5.00 | 9.3 | 29 | 1.03 | 1.05 | 1.16 | 1.38 | 1.8 |
| 12 | 1.25 | 1.48 | 2.51 | 4.70 | 8.7 | 30 | 1.02 | 1.04 | 1.12 | 1.29 | 1.6 |
| 13 | 1.23 | 1.44 | 2.40 | 4.41 | 8.1 | 31 | 1.01 | 1.03 | 1.09 | 1.21 | 1.4 |
| 14 | 1.21 | 1.41 | 2.28 | 4.13 | 7.5 | 32 | 1.01 | 1.02 | 1.06 | 1.15 | 1.3 |
| 15 | 1.19 | 1.37 | 2.17 | 3.86 | 6.9 | 33 | 1.01 | 1.01 | 1.04 | 1.09 | 1.2 |
| 16 | 1.18 | 1.34 | 2.07 | 3.61 | 6.4 | 34 | 1.00 | 1.01 | 1.02 | 1.05 | 1.1 |
| 17 | 1.16 | 1.31 | 1.97 | 3.37 | 5.9 | 35 | 1.00 | 1.00 | 1.01 | 1.02 | 1.00 |
| 18 | 1.14 | 1.28 | 1.87 | 3.14 | 5.4 | 36 | 1.00 | 1.00 | 1.00 | 1.01 | 1.00 |
|  |  |  |  |  |  | 37 | 1.00 | 1.00 | 1.00 | 1.00 | 1.00 |

The baffle plates 29 of the column numbers 3-1 to 3-5 each have seventy-two baffle holes having uniform pore sizes and arranged at uniform intervals, and has a pitch circle radius r of 120 mm. With the pore sizes being varied, a simulation was performed on the optimum thickness variation required for uniform exhaust. The process conditions and the duct radiuses are the same as in the case shown in FIG. 5.

For ease of processing a baffle plate 29, the minimum thickness $L_n$ of the baffle plate 29 was set at 1 mm, and the minimum limit pore size $D_0 > 2.55$ mm for the baffle holes 31 was obtained by the equation (55). Experiments were then carried out on the cases where the minimum limit pore size $D_0$ of 3 mm to 6 mm. Table 7 shows the plate thicknesses corresponding to the baffle holes 31 at the downstream side and the upstream side of the gas flow, the duct inner pressures, the differential pressures between both sides of the baffle holes 31, and the gas flow rates per hole in the cases shown by the column numbers 3-1 to 3-5.

In Table 8, the plate thicknesses of the respective baffle holes in greater details in the cases indicated by the column numbers 3-1 to 3-5. In accordance with Table 8, the flow rates of the respective cases are uniform, regardless of the locations of the baffle hole 31. As a result, the variation rate at the location where the pore size is 5 mm greater is too high, and accordingly, it can be said that it is suitable to design the thickness of a baffle plate with the baffle hole diameters 3 to 4 mm.

As is apparent from the equation (50), by the above method for obtaining uniform exhaust by adjusting the thickness of the baffle plate 29, the optimum thicknesses can be obtained regardless of the process conditions, such as the gas temperature, pressure, flow rate, and viscosity. Therefore, the results of a simulation performed under different process conditions are omitted. Other test results in cases where the number of baffle holes is different and the equivalent diameter of the duct is different can be easily obtained by the foregoing relational expressions in the same manner. However, it should be understood that the range in which the baffle plate 29 of the third embodiment of the present invention can be obtained is limited by the conditions specified by the equation (55).

Fourth Embodiment

A fourth embodiment of the present invention is a slit-type baffle plate provided with slits (baffle slits) having various widths so as to obtain uniform exhaust.

Figure 13:
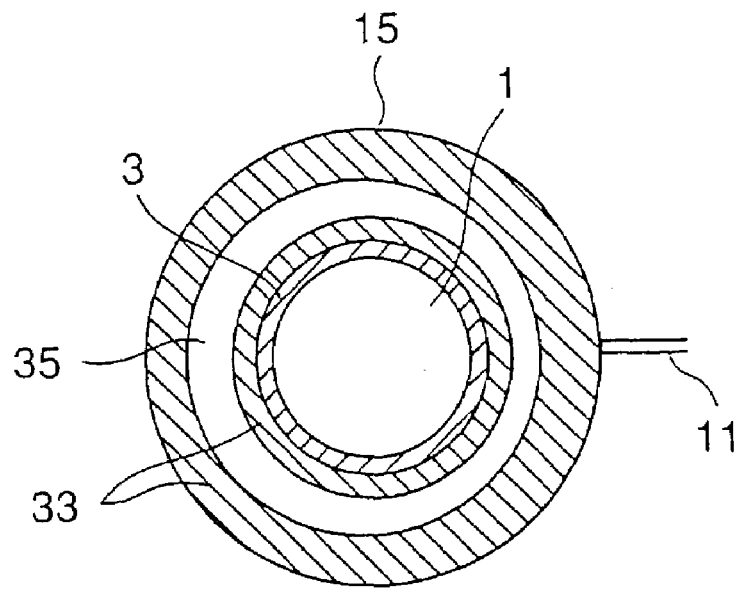
FIG. 13 shows the structure of a baffle plate of a fourth embodiment of the present invention.
Figure 14:
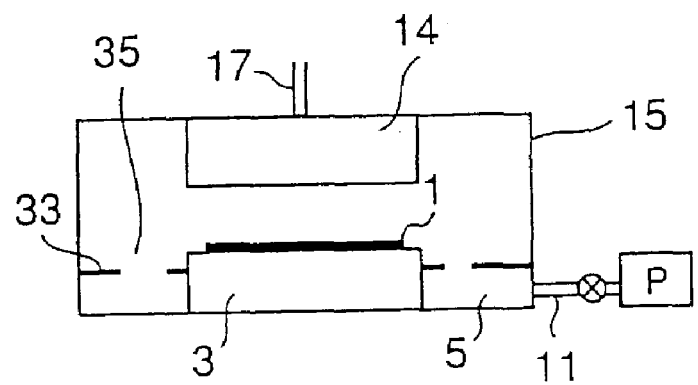
FIG. 14 shows the structure of a gas process chamber on which the baffle plate shown in FIG. 13 is mounted.

FIG. 13 shows the structure of a baffle plate 33 of the fourth embodiment. FIG. 14 shows the structure of a gas process chamber on which the baffle plate is mounted. The baffle plate is a porous type, in which the conductance is adjusted by varying the intervals and diameters of the baffle holes formed around the wafer, or varying the thickness of the baffle plate, so as to obtain uniform exhaust. In the baffle plate of this embodiment, on the other hand, the conductance of the gas flow through exhaust slits (baffle slits) 35 that penetrate the surrounding area of the wafer 1 is adjusted. The widths of the slits 35 and the thickness of the baffle plate 33 are varied in the circumferential direction, thereby obtaining uniform exhaust in the circumferential direction.

This baffle plate 33 is advantageous in that it is capable of continuously exhausting in the circumferential direction. Accordingly, the baffle plate 33 is suitable as a low differential pressure baffle (great conductance baffle) for realizing uniform exhaust in a low-pressure process chamber.

Next, theoretical equations for designing the baffle plate 33 provided with the slits will be described. Here, the equations for obtaining a fluid pressure loss of the baffle plate provided with the slits are analyzed, and the relational expressions for determining the optimum slit widths and the thickness variation of baffle plate 33.

After the equivalent diameter $D_H$ of the cross section of a rectangular pipe with a long side a and a short side b, the pipe diameter of the Fanning's equation is tuned into the following equations, with a being infinite.

$$D_H = 4 \times \text{cross section of the pipe/circumference} = 4ab/(2a+2b) \rightarrow 2b \quad (56)$$

$$Re = D_H \rho U/\mu \quad (57)$$

(U is the average flow rate in cross section)

In the equation (57), Re indicates the Reynold's number, U indicates the average flow rate in cross section, and ρ indicates the density of the fluid. The fluid pressure loss Δp is expressed as follows.

$$\Delta P = 32 \mu L U/(b^2 X/2) \quad (58)$$

A value 16/3 is then substituted as X in the equation (58), and the fluid pressure loss Δp is expressed as follows.

$$\Delta P = 12 \mu L U / b^2$$

$$f = 24/Re \quad (59)$$

Meanwhile, the friction loss coefficient f is indicated by 24/Re. Taking into account an influence of an air expansion on the flow rate due to a variation in pressure, the following equation is obtained in the same manner as in the foregoing embodiment.

$$\Delta^0 P_i = {}^0 P - ({}^0 P^2 - 24\mu L_i RT^0 G_i / M b_i^2)^{0.5} \quad (60)$$

wherein: i indicates a circumferential angle, with the location of the connecting port of the exhaust pipe being the origin; $\Delta^0 P_i$ indicates a differential pressure between the inner pressure $P_i$ of the exhaust duct at a location i and the chamber inner pressure $^0 P$; $L_i$ indicates the thickness of the slit plate at the location i; $b_i$ indicates the slit width at the location of the circumferential angle i; and $^0 G_i$ indicates the mass velocity of the gas flowing from the chamber into the area having the unit angle width of the corresponding slit i. To determine the slit width required for obtaining uniform exhaust in the circumferential direction, and the thickness variation of the baffle plate 33 in the circumferential direction, the following calculation is made.

The relationship between the pressure loss and the gas flow rate between the angle positions i+di and i in the exhaust duct 5 is approximately expressed as follows.

$$\Delta P_{i+di,i} = P_{i+di} - P_i \quad (61)$$

$$= \{P_i^2 + 64 \mu r(di)(\pi/180) RT G_{i+di,i}/MD_H^2\}^{0.5} - P_i$$

wherein the $r(di)(\pi/180)$ is the length of the exhaust duct 5 per angle (di), with the radius of the pitch circle of the duct being r, and $G_{i+di,i}$ is the mass flow rate of the gas flowing through the exhaust duct between the angle positions $(i+di)°$ and the i°. $D_H$ is an equivalent diameter of the exhaust duct 5.

From the relationship between $\Delta^0 P_i$ and $\Delta P_{i+di}$, the following equation holds.

$$\Delta^0 P_{i+di,i} = \Delta^0 P_i - \Delta P_{i+di,i} \quad (62)$$

From this equation, the following equation holds.

$$\Delta^0 P_{i+di} = {}^0 P - P_{i+di} \quad (63)$$

$$= P_i - \{P_i^2 + 64\mu(\pi r/180)(di)RT G_{i+di,i}/MD_H^2\}^{0.5} + \Delta^0 P_i$$

$$= P_i - \{P_i^2 + 64\mu(\pi r/180)(di)RT G_{i+di,i}/MD_H^2\}^{0.5} + {}^0 P -$$

$$({}^0 P^2 - 24\mu L_i RT^0 G_i / M b_i^2)^{0.5}$$

wherein $^0 G_i$ is the mass flow rate of the gas passing through the slits per 1° open area at the angle i° position. With the total flow rate at the time of uniform exhaust being $^0 F$, and the average exhaust flow rate f being $^0 F/360$ [sccm/deg], the following equation holds.

$$^0 G_i = f(1E-6/60)(M/0.0224)/\{(b_i)(\pi r/180)\} \quad (64)$$

The $F_{i+di,i}$ is the flow rate [sccm] of the gas flowing through the exhaust duct 5 between i° and i+di°, which is an approximate value of the total flow rate of the gas discharged from the slits 35 into the exhaust duct 5 between 180 and i°.

$$F_{i+di,i} = (180-i)f = (180-i) {}^0 F/360$$

$$G_{i+di,i} = F_{i+di,i}(1E-6/60)(M/0.0224)/\{(\pi/4)D_H^2\}$$

$$G_{i+di,i} = (180-i)f(1E-6/60)(M/0.0224)/(\pi/4)D_H^2\} \quad (65)$$

The equations (61) and (63) are then substituted in the equations (64) and (65) to obtain the following equations.

$$\Delta P_{i+di,i} = [P_i^2 + (4)(64)\mu RTrf(di)(1/180)(180-i)(1E-6/60)(1/0.0224)/D_H^4]^{0.5} - P_i \quad (66)$$

$$\Delta^0 P_{i+di} = P_i - \{P_i^2 + (4)(64)\mu RTrf(di)(1/180)(180-i)(1E-6/60)(1/0.0224)/D_H^4\}^{0.5} + {}^0 P - \{{}^0 P^2 - 24\mu L_i RT f(180/\pi r)(1E-6/60)(1/0.0224)/b_i^3\}^{0.5} \quad (67)$$

To simplify the above equations, the constants can be expressed as follows.

$$\alpha = 24 \mu RT(180/\pi)(1E-6/60)(1/0.0224) \quad (68)$$

$$\beta = (4)(64)\mu RT(1E-6/60)(1/0.0224)/D_H^4 \quad (69)$$

$$\Delta P_{i+di,i} = [P_i^2 + \beta fr(di)(1/180)(180-i)]^{0.5} - P_i \quad (70)$$

$$\Delta^0 P_{i+di} = P_i - \{P_i^2 + \beta fr(di)(1/180)(180-i)\}^{0.5} + {}^0 P - \{{}^0 P^2 - \alpha f L_i / r b_i^3\}^{0.5} \quad (71)$$

Since the pressure $P_0$ immediately below the slit at the first angle 0° is equal to or higher than the suction limit pressure P*, the following equation holds.

$$P_0 = (^0P^2 - \alpha f L_0/r b_0^3)^{0.5} > P^* \qquad (72)$$

The conditions of the smallest width $b_0$ of the slits can be expressed as follows.

$$b_0 > \{(\alpha f L_0/r)/(^0P^2 - P^{*2})\}^{1/3} \qquad (73)$$

With the pressure immediately below the angle di° being $P_{di}$, the average exhaust flow rate $F_0$ in the first section is expressed as (180-di)f. Accordingly, the following equation holds.

$$\Delta^0 P_{0+di} = {}^0P - P_{0+di}$$

$$= P_0 - \{P_0^2 + \beta fr(di)(1/180)(180-0)\}^{0.5} + {}^0P -$$

$$\{^0P^2 - \alpha f L_0/r b_0^3\}^{0.5}$$

$$^0P - P_{0+di} = P_0 - \{P_0^2 + \beta fr(di)(1/180)(180-0)\}^{0.5} + {}^0P - \{^0P^2 - \alpha f L_0/r b_0^3\}^{0.5}$$

$$P_{di} = -P_0 + \{P_0^2 + \beta fr(di)(1/180)(180-0)\}^{0.5} + \{^0P^2 - \alpha f L_0/r b_0^3\}^{0.5}$$

Strictly speaking, the differential equations can be calculated by a Runge-Kutta method using a computer. However, greatest plate thickness $L_0$ where the slit width $b_0$ is constant, $P_0$ is obtained from the equation (72), and $P_i$ is obtained from the following equation.

$$P_i = -P_0 + \{P_0^2 + \beta fr(1)(1/180)(180-0)\}^{0.5} + \{^0P^2 - \alpha f L_0/r b_0^3\}^{0.5} \qquad (74)$$

With the obtained $P_i$, the slit width $b_{i+1}$ or the plate thickness $L_{i+1}$ can be obtained from the following equations (75) and (76).

$$b_{i+1} = [\alpha f L_{i+1}/r\{^0P^2 - P_i^2 - \beta fr(1)(1/180)(180-i)\}]^{1/3} \qquad (75)$$

$$L_{i+1} = b_{i+1}^3 (r/\alpha f)\{^0P^2 - P_i^2 - \beta fr(1)(1/180)(180-i)\} \qquad (76)$$

The above equations (75) and (76) are substituted in the following equation, so as to obtain the value $P_{i+1}$.

$$P_{i+1} = \{^0P^2 - \alpha f L_{i+1}/r b_{i+1}^3\}^{0.5} = \{P_i^2 + \beta fr(1)(1/180)(180-i)\}^{0.5} \qquad (77)$$

The inner pressures of the exhaust duct 5 in a case where i is 0, 1, 2, . . . are sequentially calculated, so that the slit width $b_1$ for uniform exhaust and the variation of the thickness $L_i$ of the baffle plate 33 are determined.

Table 9 shows specific examples of the uniform-thickness slit-type baffle plate 33 obtained by determining the variation of the slit widths required for obtaining uniform exhaust in the chamber. The process conditions of the data shown in Table 9 are the same as the process conditions as in Table 1.

TABLE 9

| COLUMN NUMBER | | 4-1 | | 4-2 | | 4-3 | |
|---|---|---|---|---|---|---|---|
| CHAMBER PRESSURE | Pa | 93.3 | | 93.3 | | 93.3 | |
| TOTAL GAS FLOW RATE | sccm | 1203 | | 1203 | | 1203 | |
| TEMPERATURE | ° C. | 520 | | 520 | | 520 | |
| GAS VISCOSITY | Pa·s | 3.63E − 05 | | 3.63E − 05 | | 3.63E − 05 | |
| BAFFLE PLATE THICKNESS | mm | 1 | | 1 | | 2 | |
| DUCT EQUIVALENT DIAMETER | mm | 27.3 | | 27.3 | | 27.3 | |
| MAXIMUM & MINIMUM WIDTHS | | MAXIMUM | MINIMUM | MAXIMUM | MINIMUM | MAXIMUM | MINIMUM |
| SLIT WIDTH | mm | 1.21 | 1.0 | 1.92 | 1.2 | 2.34 | 1.5 |
| DIFFERENTIAL SUCITON PRESSURE | Pa | 23.5 | 49.6 | 5.3 | 24.1 | 5.9 | 24.8 |
| DUCT INNER PRESSURE | Pa | 69.8 | 43.8 | 88.0 | 69.2 | 87.5 | 68.5 |
| FLOW RATE PER UNIT ANGLE | sccm | 3.34 | 3.34 | 3.34 | 3.34 | 3.34 | 3.34 |
| UNIFORMITY (m.m. METHOD) | % | 0.00% | | 0.00% | | 0.00% | |
| COLUMN NUMBER | | 4-4 | | 4-5 | | | |
| CHAMBER PRESSURE | Pa | 93.3 | | 93.3 | | | |
| TOTAL GAS FLOW RATE | sccm | 1203 | | 1203 | | | |
| TEMPERATURE | ° C. | 520 | | 520 | | | |
| GAS VISCOSITY | Pa·s | 3.63E − 05 | | 3.63E − 05 | | | |
| BAFFLE PLATE THICKNESS | mm | 3 | | 3 | | | |
| DUCT EQUIVALENT DIAMETER | mm | 27.3 | | 27.3 | | | |
| MAXIMUM & MINIMUM WIDTHS | | MAXIMUM | MINIMUM | MAXIMUM | MINIMUM | | |
| SLIT WIDTH | mm | 1.88 | 1.5 | 3.39 | 1.8 | | |
| DIFFERENTIAL SUCITON PRESSURE | Pa | 18.3 | 41.6 | 2.9 | 21.0 | | |
| DUCT INNER PRESSURE | Pa | 75.0 | 51.7 | 90.5 | 72.3 | | |
| FLOW RATE PER UNIT ANGLE | sccm | 3.34 | 3.34 | 3.34 | 3.34 | | |
| UNIFORMITY (m.m. METHOD) | % | 0.00% | | 0.00% | | | | the principles will be described below by the Euler's method, which is simplified for ease of explanation.

Based on the smallest slit width $b_0$ at the angle position 0° where the plate thickness $L_0$ is constant, or based on the The lowest limit of the slit widths in a case where the thickness $L_0$ of the baffle plate 33 is 0.92 mm. Accordingly, the thicknesses are 1 mm, 2 mm, and 3 mm, while the smallest slits widths $b_0$ are 1 mm, 1.2 mm, 1.5 mm, and 1.8 mm, as shown in Table 9. A simulation was performed for each of the cases. Under each of the numbers shown in Table 9, the inner pressures of the exhaust duct 5 corresponding to the smallest slit width and the greatest slit width, the differential pressure (differential suction pressure) between both sides of each of the slits 35, the flow rate of the gas discharged from the slits per unit angle 1°, and the uniformity of the exhaust flow rates are shown.

As can be seen from Table 9, the exhaust flow rate is uniform in any case. Where the plate thickness is as small as 1 mm, the variation range of the slit widths is narrow, and the variation of the widths in the circumferential direction is in a very narrow range of 1 mm to 1.21 mm. This implies that the required precision in processing and assembling of the baffle plate 33 is very high. However, in the case of the column number 4-5 shown in Table 9 in which a baffle plate having a thickness of 3 mm, the slit widths vary in the range of 1.8 mm to 3.39 mm, and the variation range on the circumference is greater.

Figure 15:
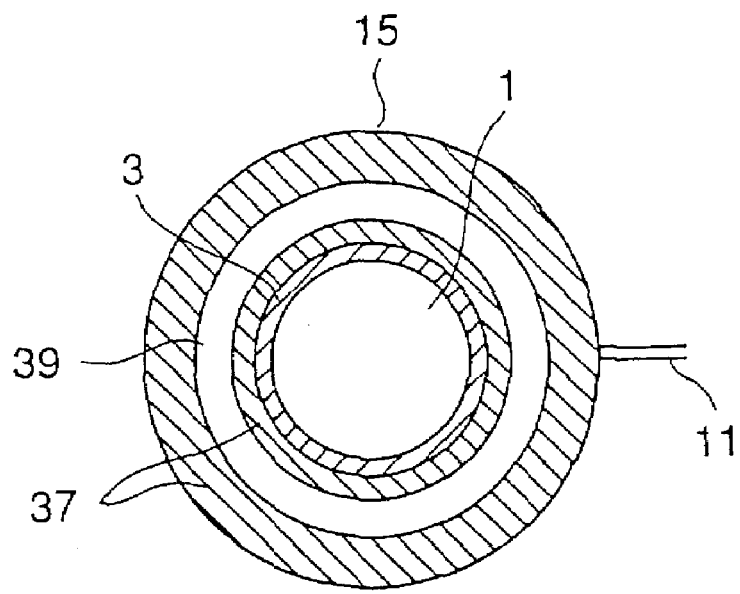
FIG. 15 shows the structure of a baffle plate of a fifth embodiment of the present invention.
Figure 16:
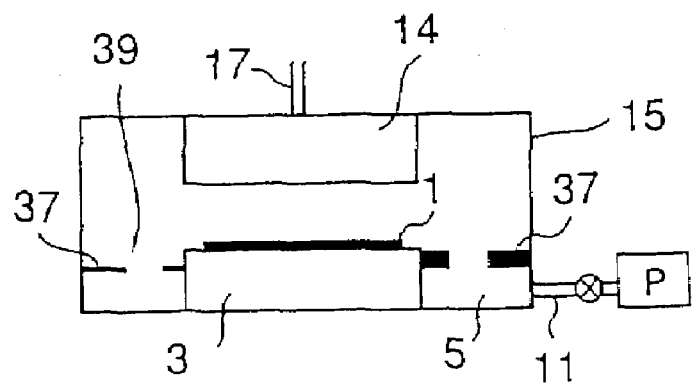
FIG. 16 shows the structure of a has process chamber on which the baffle plate shown in FIG. 15 is mounted.

FIG. 15 shows the structure of the baffle plate of the fifth embodiment of the present invention. FIG. 16 shows the structure of a gas process chamber on which the baffle plate of this embodiment is mounted. As shown in FIGS. 15 and 16, to obtain uniform exhaust in the chamber by a slit-type baffle plate 37, the equation (76) of the fourth embodiment is used so as to optimize the thickness variation of the baffle plate 37, while maintaining the widths of through slits 39 uniform.

In order to keep the exhaust flow rates in the circumferential direction constant, the thickness variation of the baffle plate 37 in the circumferential direction was examined under the same process conditions as in the cases shown in Table 1. More specifically, the widths of the slits 39 were made uniform in the circumferential direction, while the widths of the other slits 39 were varied in the range of 1.8 mm to 2.5 mm. The greatest thickness of the baffle plate 37 was 5 mm or 10 mm, the uniformity of the exhaust flow rates were examined through simulations. Table 10 shows the result of the simulations.

TABLE 10

| COLUMN NUMBER | | 5-1 | | 5-2 | | 5-3 | |
|---|---|---|---|---|---|---|---|
| CHAMBER PRESSURE | Pa | 93.3 | | 93.3 | | 93.3 | |
| TOTAL GAS FLOW RATE | sccm | 1203 | | 1203 | | 1203 | |
| TEMPERATURE | ° C. | 520 | | 520 | | 520 | |
| GAS VISCOSITY | Pa · s | 3.63E – 05 | | 3.63E – 05 | | 3.63E – 05 | |
| SLIT WIDTH | mm | 1.8 | | 2.1 | | 2.1 | |
| DUCT EQUIVALENT DIAMETER | mm | 27.3 | | 27.3 | | 27.3 | |
| MAXIMUM & MINIMUM WIDTHS | | MAXIMUM | MINIMUM | MAXIMUM | MINIMUM | MAXIMUM | MINIMUM |
| SLIT THICKNESS | mm | 2.47 | 5.0 | 0.98 | 5.0 | 5.98 | 10 |
| DIFFERENTIAL SUCITON PRESSURE | Pa | 17.0 | 39.7 | 4.0 | 22.4 | 27.7 | 56.5 |
| DUCT INNER PRESSURE | Pa | 76.3 | 53.6 | 89.4 | 70.9 | 65.6 | 36.8 |
| FLOW RATE PER UNIT ANGLE | sccm | 3.34 | 3.34 | 3.34 | 3.34 | 3.34 | 3.34 |
| UNIFORMITY | % | 0.00% | | 0.00% | | 0.00% | |
| COLUMN NUMBER | | | | 5-4 | | 5-5 | |
| CHAMBER PRESSURE | Pa | | | 93.3 | | 93.3 | |
| TOTAL GAS FLOW RATE | sccm | | | 1203 | | 1203 | |
| TEMPERATURE | ° C. | | | 520 | | 520 | |
| GAS VISCOSITY | Pa · s | | | 3.63E – 05 | | 3.63E – 05 | |
| SLIT WIDTH | mm | | | 2.5 | | 2.0 | |
| DUCT EQUIVALENT DIAMETER | mm | | | 27.3 | | 27.3 | |
| MAXIMUM & MINIMUM WIDTHS | | | | MAXIMUM | MINIMUM | MAXIMUM | MINIMUM |
| SLIT WIDTH | mm | | | 3.22 | 10 | 6.53 | 10 |
| DIFFERENTIAL SUCITON PRESSURE | Pa | | | 7.9 | 27.4 | 37.2 | 79.3 |
| DUCT INNER PRESSURE | Pa | | | 85.5 | 66.0 | 56.1 | 14.1 |
| FLOW RATE PER UNIT ANGLE | sccm | | | 3.34 | 3.34 | 3.34 | 3.34 |
| UNIFORMITY | % | | | 0.00% | | 0.00% | |

As is apparent from Table 9, with the baffle plate 33 of this embodiment, the optimum variation of the plate thickness can be easily obtained.

It should be understood that the baffle plate is not necessarily formed by an integral component, but may be made up of a plurality of components.

Fifth Embodiment

A fifth embodiment of the present invention is a baffle plate having slits of uniform widths. The thickness of this baffle plate is varied so as to obtain uniform exhaust.

When the widths of the slits are 3 mm or greater, the greatest thickness of the baffle plate 37 on the side of the exhaust pipe 11 is as thick as several centimeters, which is not a practical value. This is because the fluid pressure loss of the slits 39 is inversely proportional to the cube of the width of each slit 39, while being proportional to the thickness of the baffle plate 37. Also, if the inner pressure of the exhaust duct 5 is low and the differential suction pressure is high enough, the widths of the slits 39 are preferably maintained at a small constant value, so that the exhaust flow rate in the circumferential direction can be adjusted while maintaining a thickness variation within a range of 1 mm to 3 mm.

As described above, in accordance with the fifth embodiment of the present invention, the uniform-width slit-type baffle plate 37 having the optimum shape can be efficiently and readily designed.

Sixth Embodiment

Figure 17:
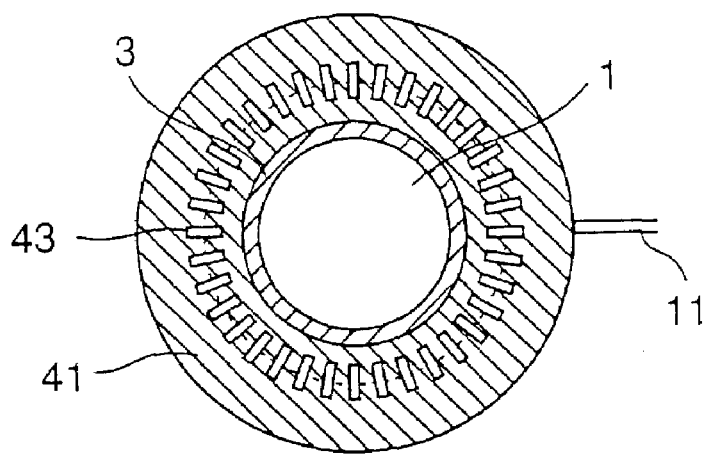
FIG. 17 shows the structure of a baffle plate of a sixth embodiment of the present invention.
Figure 18:
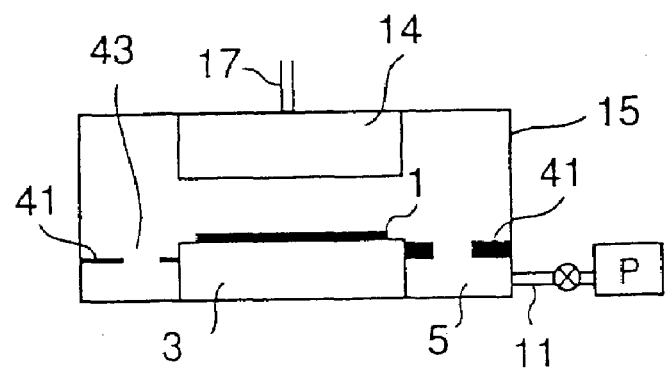
FIG. 18 shows the structure of a gas process chamber on which the baffle plate shown in FIG. 17 is mounted.

FIG. 17 shows the structure of a baffle plate of a sixth embodiment of the present invention, and FIG. 18 shows the structure of a gas process chamber on which the baffle plate of this embodiment is mounted. As shown in FIG. 18, a baffle plate 41 of this embodiment is a type of porous baffle plate that varies in thickness. The shape of each baffle hole 43 is not circular but rectangular. As in this embodiment, the shape of baffle holes (or baffle passages) of the present invention is not limited to a rectangle. Also, in a case of circular baffle holes, they are not necessarily arranged on a single pitch circle, but may be arranged on a plurality of pitch circles having different circles.

In this embodiment, however, the conductance of the baffle holes (or baffle passages) should be made equal to the conductance of circular baffle holes arranged on a single pitch circle. In the case of the rectangular baffle holes 43, the equivalent diameter $Dh=2ab/(a+b)$, which is obtained from the long side a and the short side b, should be made equal to the diameter of a desired circular hole.

Meanwhile, a technique of dividing one baffle hole into a plurality of baffle holes having the same functions is also advantageous, and this technique may be applied to either an entire pitch circle or a partial pitch circle. For instance, in a case where a wafer is processed by a method using plasma, it is necessary to prevent a plasma gas from passing through the baffle plate and flowing toward the exhaust side. Therefore, with the baffle plate of the second embodiment in which the diameters of the baffle holes are varied in the circumferential direction, each baffle hole having a great diameter may have to be replaced by a plurality of baffle holes having small diameters. In such a case, the fluid pressure loss based on the gas flow rate divided by the number of the baffle holes is partially applied to the relational expressions of the foregoing embodiments, so as to determining the diameters of the baffle holes.

Seventh Embodiment

In the foregoing embodiments, only one of the factors including the hole intervals, the pore sizes, the plate thickness, or the shape of the slits, is varied to obtain uniform exhaust. In a seventh embodiment of the present invention, on the other hand, a plurality of factors are varied at the same time. For instance, the first embodiment and the second embodiment of the present invention may be combined. In such a case, baffle holes having smaller pore sizes are formed between the regular baffle holes, so that the intervals between the baffle holes near the connecting port of the exhaust pipe can be prevented from becoming too long.

However, it should be understood that varying a plurality of factors at the same time is costly, and therefore, this embodiment should be employed only for special use.

Eighth Embodiment

Figure 19:
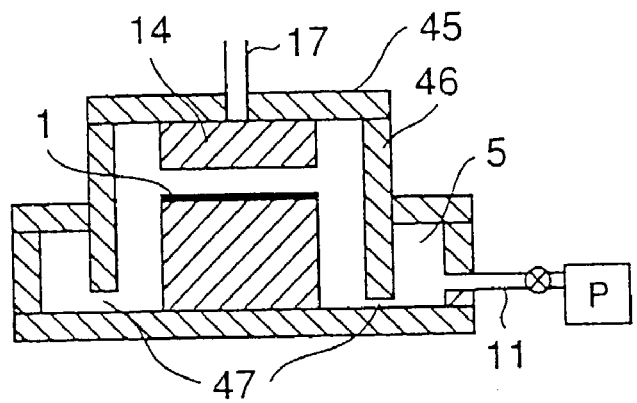
FIG. 19 shows the structure of a gas process chamber of an eighth embodiment of the present invention.
Figure 20:
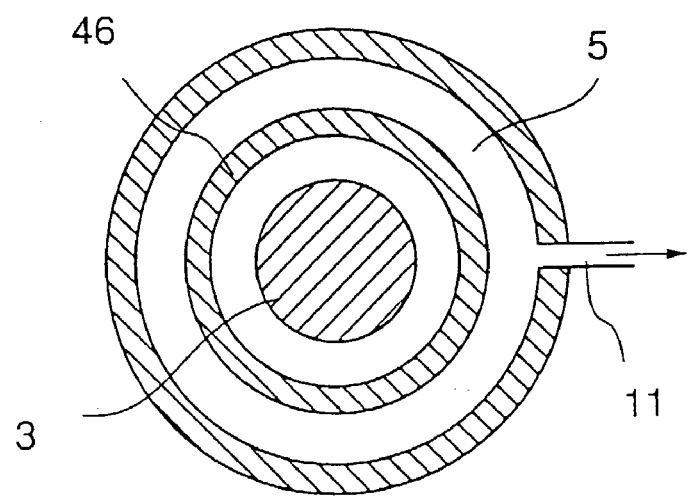
FIG. 20 is a plan view of the gas process chamber shown in FIG. 19.

FIG. 19 shows the structure of a gas process chamber of an eighth embodiment of the present invention, and FIG. 20 is a plan view of this gas process chamber.

As shown in FIGS. 19 and 20, the gas process chamber of this embodiment comprises a chamber 45 provided with a chamber wall 46 that surrounds the wafer stand 3. In this gas process chamber, exhaust slits 47 are formed at the bottom end of the chamber wall 46. The heights of the exhaust slits 47 are varied to obtain uniform exhaust as in the foregoing embodiments.

Varying the heights of the exhaust slits 47 around the wafer stand 3 has hydrodynamically the same effects as the fourth embodiment in which the widths of the slits 35 on the slit-type baffle plate 33 are varied around the wafer stand 3. In view of this, it can be said that the gas process chamber of this embodiment is a modification of the gas process chamber of the fourth embodiment.

Ninth Embodiment

Figure 21:
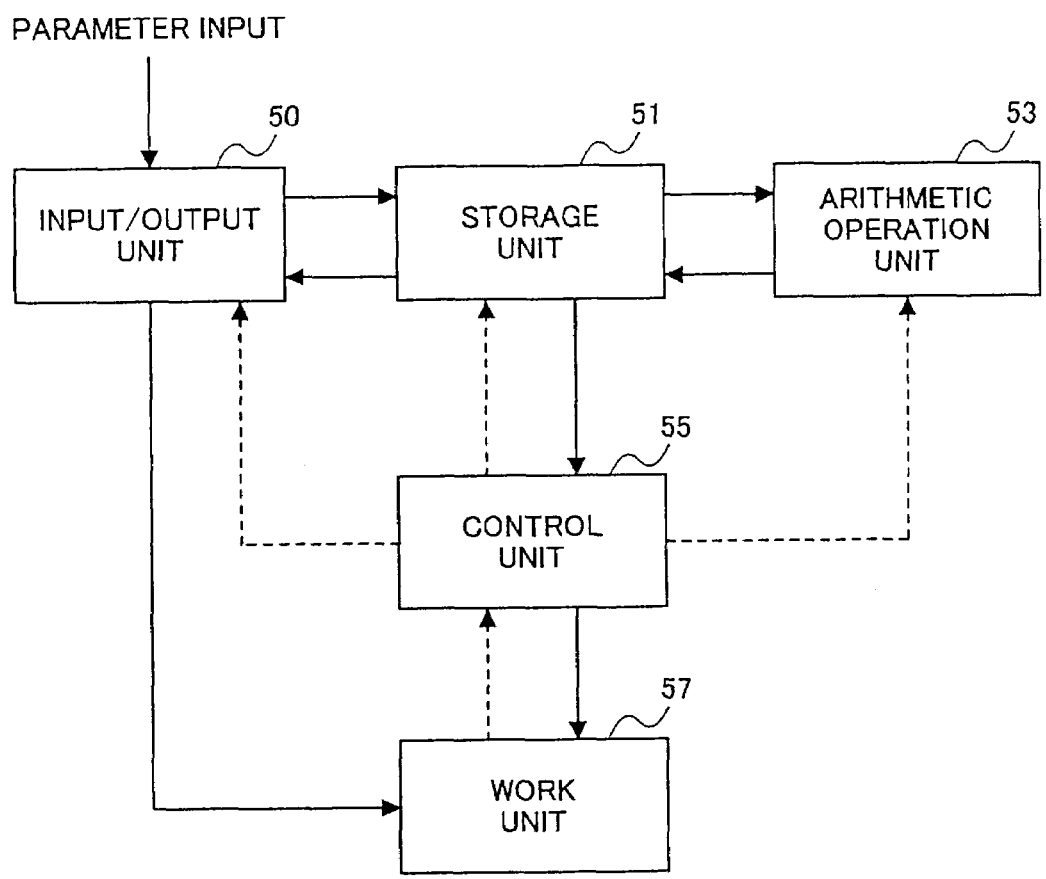
FIG. 21 shows the structure of an apparatus for producing a baffle plate of the present invention.

FIG. 21 is a block diagram showing the structure of an apparatus for producing a baffle plate of the present invention. In this block diagram, the solid lines indicate the data flow, and the broken lines indicate the flow of control signals. As shown in FIG. 21, this apparatus for producing a baffle plate comprises an input/output unit 50, a storage unit 51, an arithmetic operation unit 53, a control unit 55, and a work unit 57. Parameters such as the characteristics of the process gas, the process conditions, the shape of the exhaust duct, the size of the process chamber, are inputted in the input/output unit 50. The arithmetic operation unit 53 is connected to the storage unit 51. The work unit 57 is connected to the input/output unit 50. The control unit 55 is connected to the input/output unit 50, the storage unit 51, the arithmetic operation unit 53, and the work unit 57.

Depending on the type of process to be performed, the work unit 57 is formed by a lathe, a drilling machine, a boring machine, or a milling machine. When baffle holes are formed in the baffle plate, for instance, a drilling machine is used.

Figure 22:
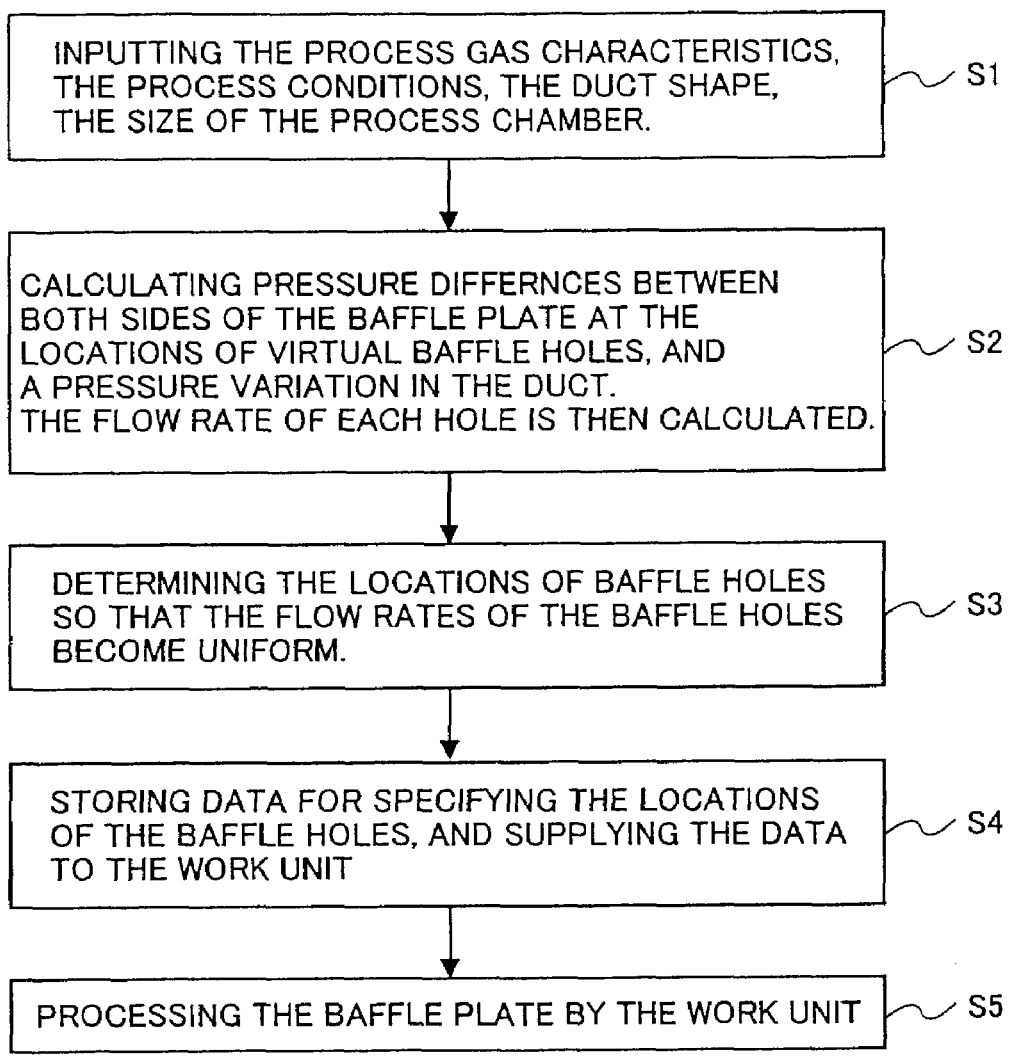
FIG. 22 is a flow chart showing an operation of producing the baffle plate shown in FIG. 21.

Referring now to a flowchart shown in FIG. 22, the operation of the apparatus for producing a baffle plate having the above structure will be described.

In step S1, the parameters such as the characteristics and the process conditions of the process gas, the shape of the exhaust duct, and the size of the process chamber are inputted into the input/output unit 50. The inputted parameters are stored in the storage unit 51.

In step S2, the control unit 55 controls the arithmetic operation unit 53 based on a flow rate calculating program according to the Hagen-Poiseuille's law, which program is stored in the storage unit 51 in advance. More specifically, in accordance with the above program, baffle holes are virtually formed on the baffle plate. The arithmetic operation unit 53 calculates the pressure difference between the two sides of the baffle plate and a pressure variation in the exhaust duct in accordance with the Hagen-Poiseuille's law, thereby determining the flow rate of the gas flowing through the baffle holes. The results of the calculation are temporarily stored in the storage unit 51 and transmitted to the control unit 55.

In step S3, the control unit 55 determines the locations and pore sizes of the baffle holes in such a manner that makes the flow rates of the baffle holes uniform. In step S4, the control unit 55 supplies the data indicating the optimum locations of the baffle holes to the work unit 57.

In step S5, based on the supplied data, the work unit 57 processes the baffle plate. The operation information of the work unit 57 is supplied to the control unit 55, which in turn controls the work unit 57 in accordance with the supplied operation information.

With the above apparatus for producing a baffle plate of the ninth embodiment of the present invention, any of the baffle plates of the foregoing embodiments can be readily produced.

What is claimed is:

1. An exhaust baffle plate that separates a process space from a duct, a chemical process being carried out within the process space with a supplied gas, and the duct being adjacent to the process space for discharging an exhaust gas generated as a result of the chemical process, the exhaust baffle plate comprising a first and a second outermost side, the second outermost side opposite to the first outermost side, and a plurality of through holes formed therein at desired locations that extend from the first outermost side to the second outermost side, wherein the exhaust baffle plate varies in thickness from the first outermost side to the second outermost side of the exhaust baffle plate at two or more locations among the desired locations outside the through holes.

2. The exhaust baffle plate as claimed in claim 1, wherein the plurality of through holes are formed so that a flow rate of the exhaust gas flowing through the through holes calculated by the Hagen-Poisueille's equation becomes constant.

3. The exhaust baffle plate as claimed in claim 1, wherein the first and second outermost sides extend from an inner to an outer perimeter of the exhaust baffle plate and wherein a thickness of the exhaust baffle plate at both the inner and outer perimeters at one of the two or more locations is different from a thickness of the exhaust baffle plate at both the inner and outer perimeter at another one of the two or more locations.

4. A process apparatus having the exhaust baffle plate as claimed in claim 1.

5. An exhaust baffle plate that separates a process space from a duct, a chemical process being carried out within the process space with a supplied gas, the duct being adjacent to the process space for discharging an exhaust gas generated as a result of the chemical process, the exhaust baffle plate comprising a first and a second outermost side, the second outermost side opposite to the first outermost side, and a plurality of slits formed in the exhaust baffle plate along a circumferential direction of the exhaust baffle plate, wherein said slits penetrate through the exhaust baffle plate from the first outermost side to the second outermost side and have uniform widths, and wherein a thickness of the exhaust baffle plate from the first outermost side to the second outermost side of the exhaust baffle plate varies along the circumferential direction of the exhaust baffle plate outside the slits.

6. The exhaust baffle plate as claimed in claim 5, wherein the slits are formed so that a flow rate of the exhaust gas flowing through the slits calculated by the Hagen-Poisueille's equation becomes constant.

7. The exhaust baffle plate as claimed in claim 5, wherein the first and second outermost sides extend from an inner to an outer perimeter of the exhaust baffle plate and wherein a thickness of the exhaust baffle plate at both the inner and outer perimeters at a circumferential position is different from a thickness of the exhaust baffle plate at both the inner and outer perimeters at another circumferential position.

8. A process apparatus having the exhaust baffle plate as claimed in claim 5.

* * * * *